United States Patent
Mochizuki et al.

(10) Patent No.: US 8,154,939 B2
(45) Date of Patent: Apr. 10, 2012

(54) CONTROL METHOD FOR NONVOLATILE MEMORY AND SEMICONDUCTOR DEVICE

(75) Inventors: Yoshinori Mochizuki, Sagamihara (JP); Masaharu Ukeda, Yokohama (JP); Shigemasa Shiota, Kodaira (JP)

(73) Assignee: Renesas Electronics Corporation, Kanagawa (JP)

( * ) Notice: Subject to any disclaimer, the term of this patent is extended or adjusted under 35 U.S.C. 154(b) by 465 days.

(21) Appl. No.: 12/494,817

(22) Filed: Jun. 30, 2009

(65) Prior Publication Data

US 2010/0034024 A1     Feb. 11, 2010

(30) Foreign Application Priority Data

Aug. 8, 2008 (JP) .................. 2008-205414

(51) Int. Cl.
   *G11C 7/00* (2006.01)
(52) U.S. Cl. ................. 365/222; 365/189.15
(58) Field of Classification Search .......... 365/222, 365/189.15, 230.03
   See application file for complete search history.

(56) References Cited

U.S. PATENT DOCUMENTS

| | | | |
|---|---|---|---|
| 5,625,791 A | 4/1997 | Farrugla et al. | |
| 6,842,484 B2 * | 1/2005 | Gandhi et al. | 375/240.24 |
| 7,212,441 B2 | 5/2007 | Yamazoe et al. | |
| 7,894,282 B2 * | 2/2011 | Pyo et al. | 365/200 |
| 2006/0140003 A1 | 6/2006 | Yamazoe et al. | |
| 2007/0237016 A1 | 10/2007 | Miyamoto et al. | |
| 2008/0094931 A1 | 4/2008 | Pyo et al. | |

FOREIGN PATENT DOCUMENTS

| | | |
|---|---|---|
| JP | 06-231317 | 8/1994 |
| JP | 2006-185530 | 7/2006 |
| KR | 2007-0027533 | 3/2007 |
| KR | 10-0806341 | 3/2008 |

OTHER PUBLICATIONS

Korean Office Action for application No. KR10-2009-58216 dated Dec. 20, 2010, together with English translation.
Office Action in Korean Patent Appln. 10-2009-58216, dated Sep. 29, 2011, (in Korean, 3 pgs); (English language translation, 4 pgs).

* cited by examiner

*Primary Examiner* — Vu Le
(74) *Attorney, Agent, or Firm* — Antonelli, Terry, Stout & Kraus, LLP.

(57) ABSTRACT

In a nonvolatile memory, the threshold is restored to a state before changing, without increasing number of writing undesirably. In a system including a nonvolatile memory, a random number generator, and a controller accessible to the nonvolatile memory, every time access to the nonvolatile memory is performed, the controller determines a refresh-targeted area, based on a random number generated by the random number generator. The controller is made to perform refresh control to re-write to the refresh-targeted area. By such refresh control, the threshold is restored to a state before changing, without increasing the number of writing undesirably.

13 Claims, 21 Drawing Sheets

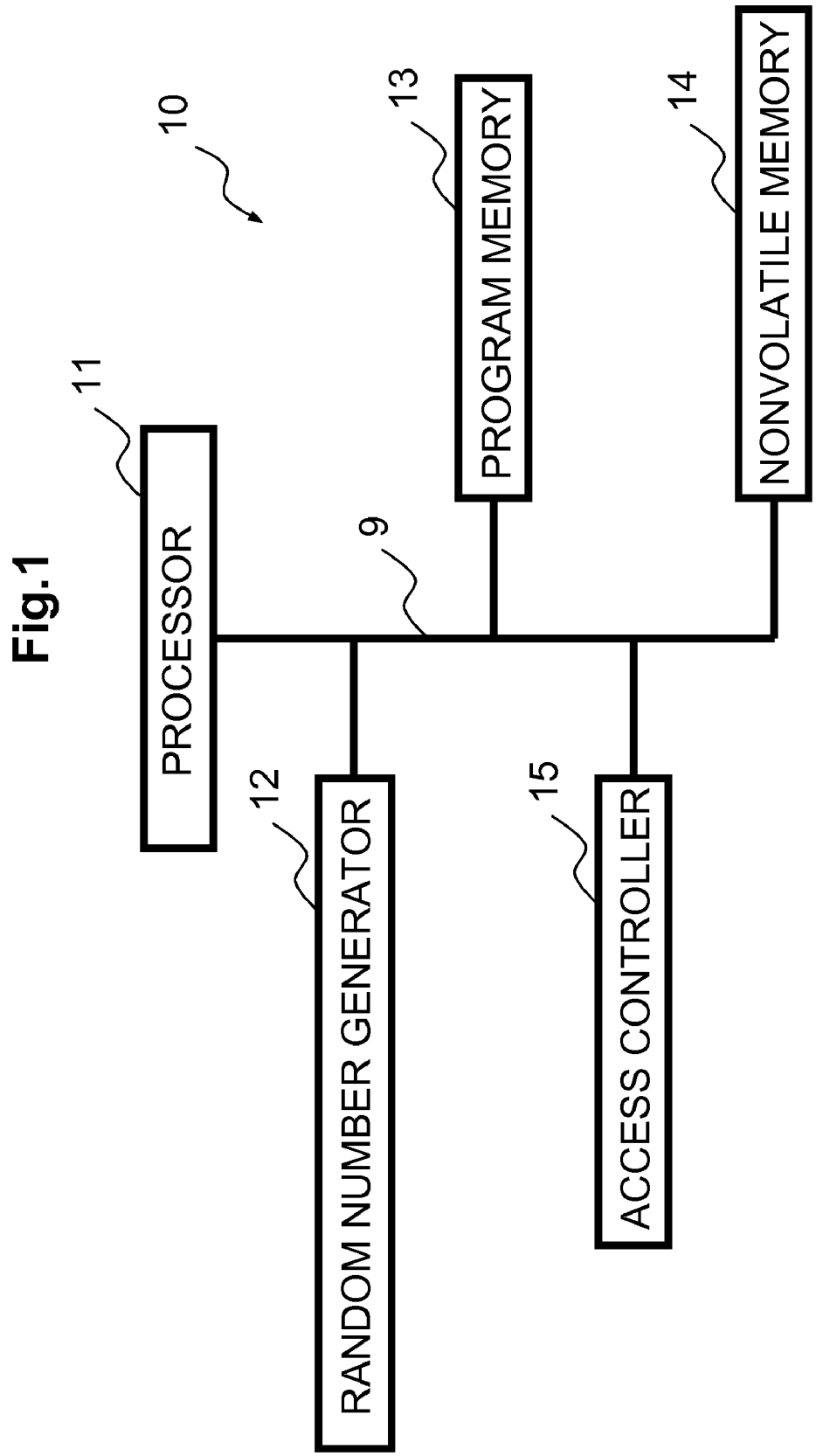

Fig.2 | Page 1 | Page 2 | Page 3 | ... | Page M | ... | Page N

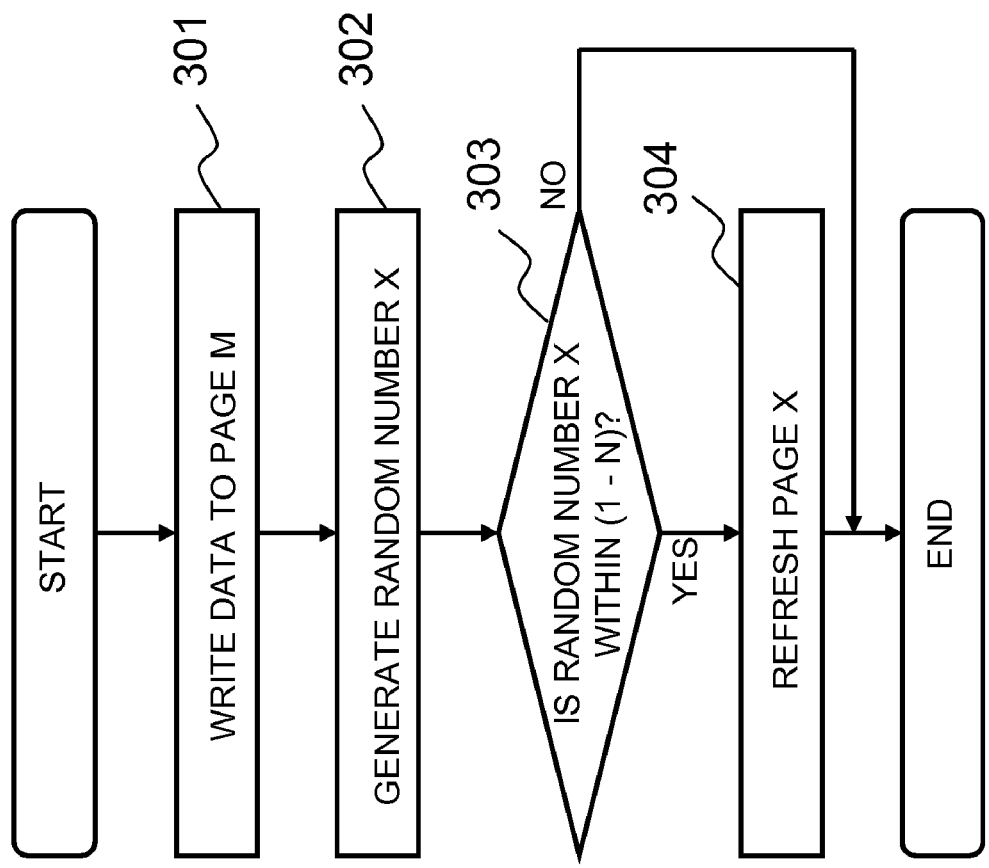

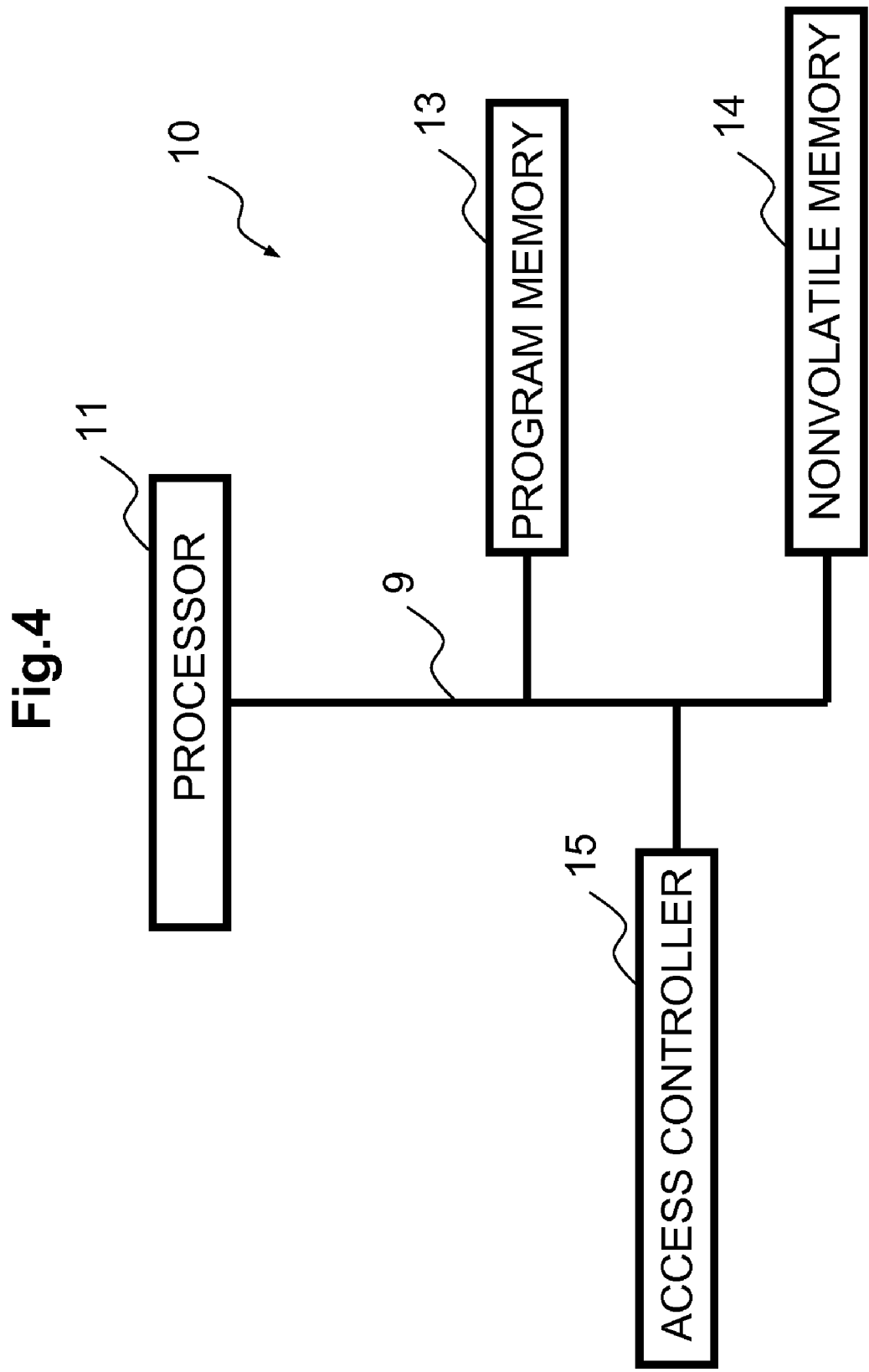

Fig.7A

| Page 1 |
| --- |
| Page 2 |
| ... |
| Page 150 |
| ... |
| Page 300 |
| ... |
| Page 511 |
| ENTIRE NUMBER OF WRITING = 0 REFRESH-TARGETED PAGE = PAGE 1 |

INITIAL STATE

Fig.7B

| Page 1 |
| --- |
| Page 2 |
| ... |
| Page 150 |
| ... |
| Page 300 |
| ... |
| Page 511 |
| ENTIRE NUMBER OF WRITING = 1 REFRESH-TARGETED PAGE = PAGE 1 |

1 TIME

Fig.7C

| Page 1 |
| --- |
| Page 2 |
| ... |
| Page 150 |
| ... |
| Page 300 |
| ... |
| Page 511 |
| ENTIRE NUMBER OF WRITING = 9999 REFRESH-TARGETED PAGE = PAGE 1 |

9999 TIMES

Fig.7D

| _Page 1_ |
| --- |
| Page 2 |
| ... |
| Page 150 |
| ... |
| Page 300 |
| ... |
| Page 511 |
| ENTIRE NUMBER OF WRITING = 10000 REFRESH-TARGETED PAGE = PAGE 1 |

10000 TIMES

Fig.7E

| Page 1 |
| --- |
| _Page 2_ |
| ... |
| Page 150 |
| ... |
| Page 300 |
| ... |
| Page 511 |
| ENTIRE NUMBER OF WRITING = 10001 REFRESH-TARGETED PAGE = PAGE 2 |

10001 TIMES

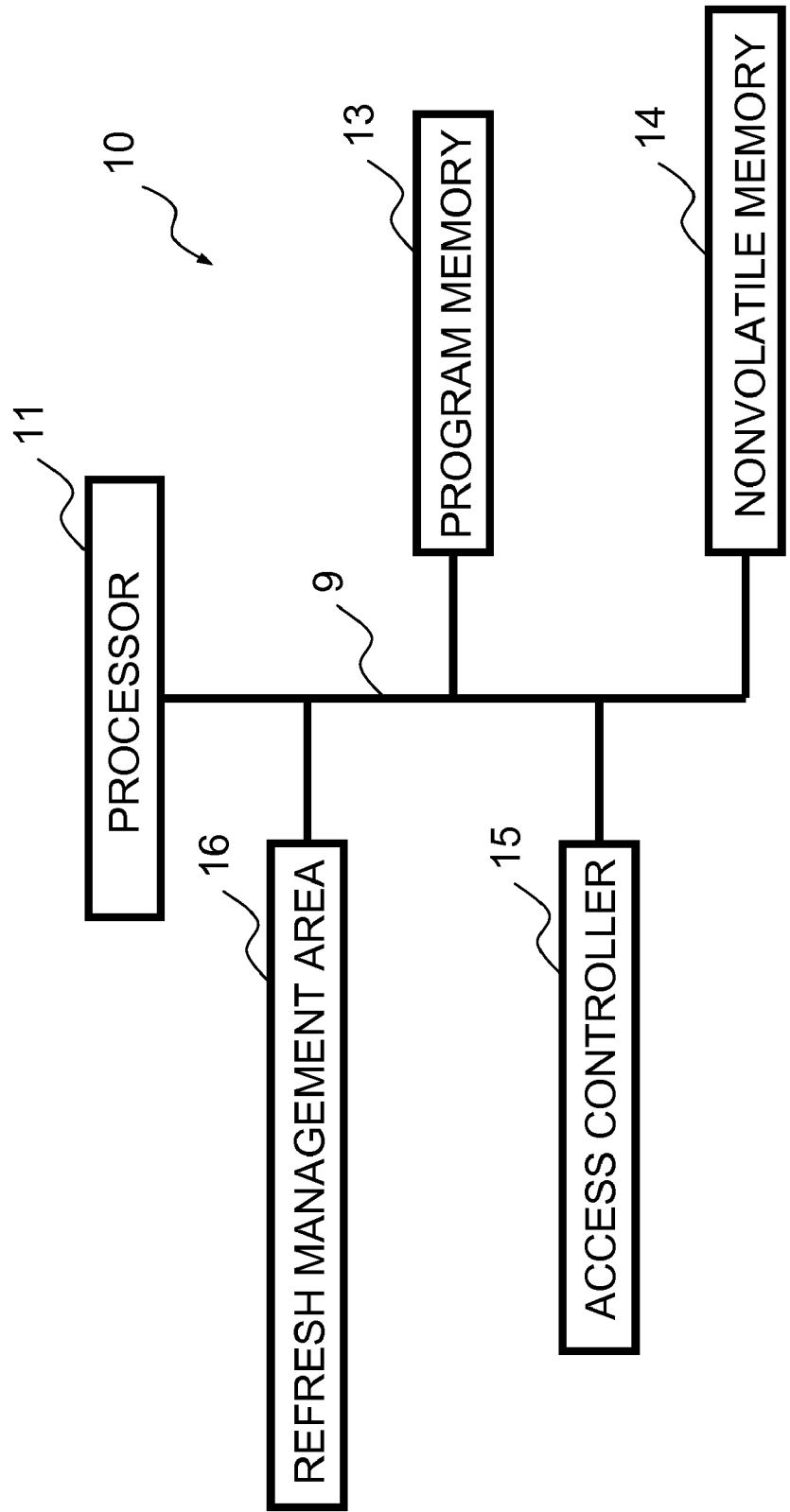

Fig.11A

| Page 1 | 0 | 0 |
| --- | --- | --- |
| Page 2 | 0 | 0 |
| ... | | |
| Page 150 | 0 | 0 |
| ... | | |
| Page 300 | 0 | 0 |
| ... | | |
| Page 511 | 0 | 0 |

INITIAL STATE

Fig.11B

| Page 1 | 0 | 0 |
| --- | --- | --- |
| Page 2 | 0 | 1 |
| ... | | |
| Page 150 | 0 | 0 |
| ... | | |
| Page 300 | 0 | 0 |
| ... | | |
| Page 511 | 0 | 0 |

1 TIME

Fig.11C

| Page 1 | 0 | 549 |
| --- | --- | --- |
| Page 2 | 0 | 42 |
| ... | | |
| Page 150 | 0 | 3419 |
| ... | | |
| Page 300 | 0 | 9999 |
| ... | | |
| Page 511 | 0 | 8283 |

9999 TIMES

Fig.11D

| Page 1 | 1 | 549 |
| --- | --- | --- |
| Page 2 | 0 | 42 |
| ... | | |
| Page 150 | 0 | 10000 |
| ... | | |
| Page 300 | 0 | 9999 |
| ... | | |
| Page 511 | 0 | 8282 |

10000 TIMES

Fig.11E

| Page 1 | 1 | 549 |
| --- | --- | --- |
| Page 2 | 1 | 42 |
| ... | | |
| Page 150 | 0 | 10000 |
| ... | | |
| Page 300 | 0 | 9999 |
| ... | | |
| Page 511 | 0 | 10001 |

10001 TIMES

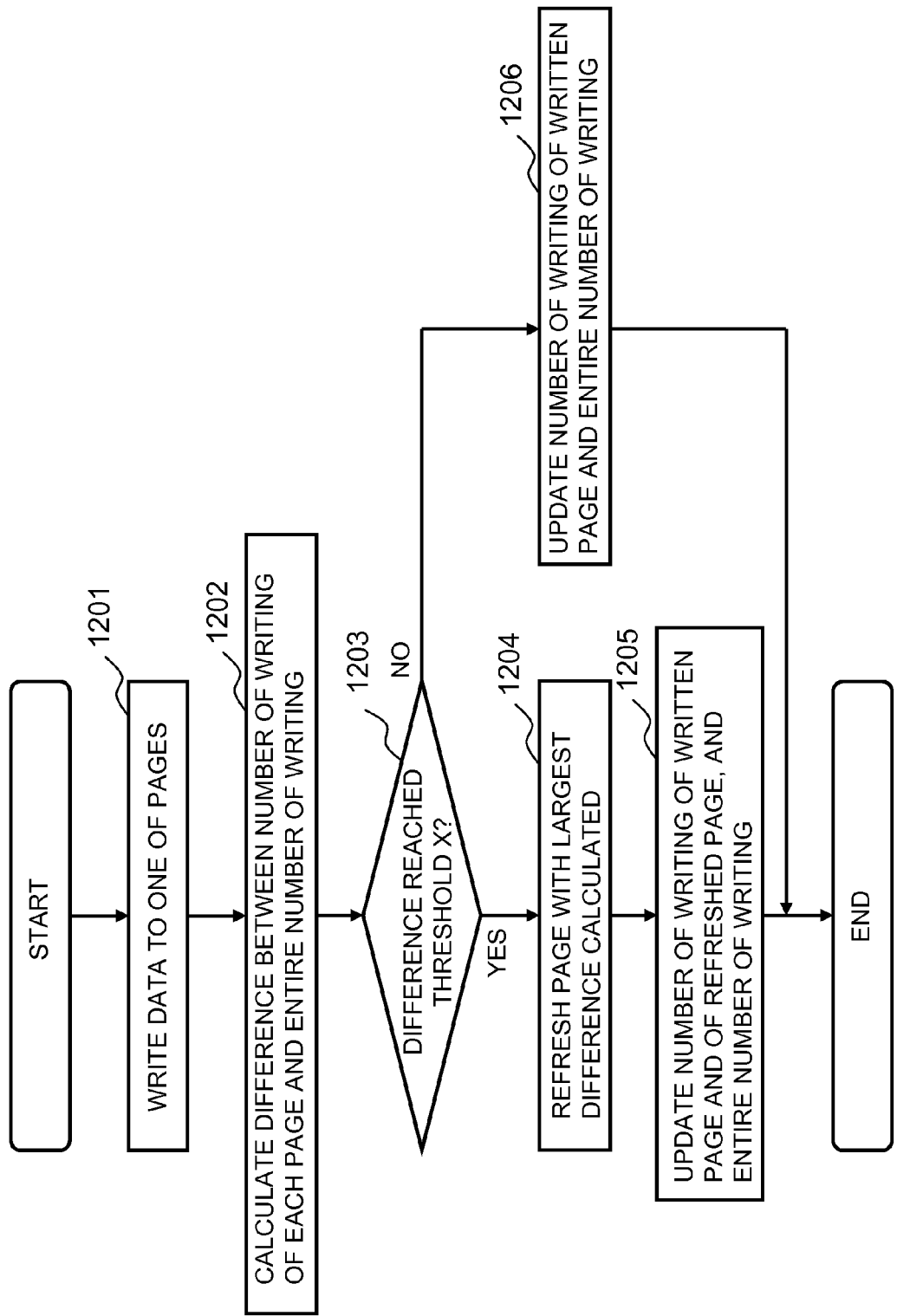

Fig.13A

| | |
|---|---|
| Page 1 | |
| Page 2 | |
| ⋮ | |
| Page 150 | |
| ⋮ | |
| Page 300 | |
| ⋮ | |
| Page 511 | |
| NUMBER OF WRITING OF PAGE 1 = 0 | |
| NUMBER OF WRITING OF PAGE 2 = 0 | |
| ⋮ | |
| NUMBER OF WRITING OF PAGE 150 = 0 | |
| NUMBER OF WRITING OF PAGE 300 = 0 | |
| NUMBER OF WRITING OF PAGE 511 = 0 | |
| ENTIRE NUMBER OF WRITING = 0 | |

INITIAL STATE

Fig.13B

| | |
|---|---|
| Page 1 | |
| Page 2 | |
| ⋮ | |
| Page 150 | |
| ⋮ | |
| Page 300 | |
| ⋮ | |
| Page 511 | |
| NUMBER OF WRITING OF PAGE 1 = 0 | |
| NUMBER OF WRITING OF PAGE 2 = 0 | |
| ⋮ | |
| NUMBER OF WRITING OF PAGE 150 = 1 | |
| NUMBER OF WRITING OF PAGE 300 = 0 | |
| NUMBER OF WRITING OF PAGE 511 = 0 | |
| ENTIRE NUMBER OF WRITING = 1 | |

1 TIME

Fig.13C

| | |
|---|---|
| Page 1 | |
| Page 2 | |
| ⋮ | |
| Page 150 | |
| ⋮ | |
| Page 300 | |
| ⋮ | |
| Page 511 | |
| NUMBER OF WRITING OF PAGE 1 = 5000 | |
| NUMBER OF WRITING OF PAGE 2 = 1000 | |
| ⋮ | |
| NUMBER OF WRITING OF PAGE 150 = 3340 | |
| NUMBER OF WRITING OF PAGE 300 = 2300 | |
| NUMBER OF WRITING OF PAGE 511 = 4300 | |
| ENTIRE NUMBER OF WRITING = 5000 | |

5000 TIMES

Fig.13D

| | |
|---|---|
| Page 1 | |
| Page 2 | |
| ⋮ | |
| Page 150 | |
| ⋮ | |
| Page 300 | |
| ⋮ | |
| Page 511 | |
| NUMBER OF WRITING OF PAGE 1 = 5000 | |
| NUMBER OF WRITING OF PAGE 2 = 5001 | |
| ⋮ | |
| NUMBER OF WRITING OF PAGE 150 = 3340 | |
| NUMBER OF WRITING OF PAGE 300 = 5001 | |
| NUMBER OF WRITING OF PAGE 511 = 4300 | |
| ENTIRE NUMBER OF WRITING = 5001 | |

5001 TIMES

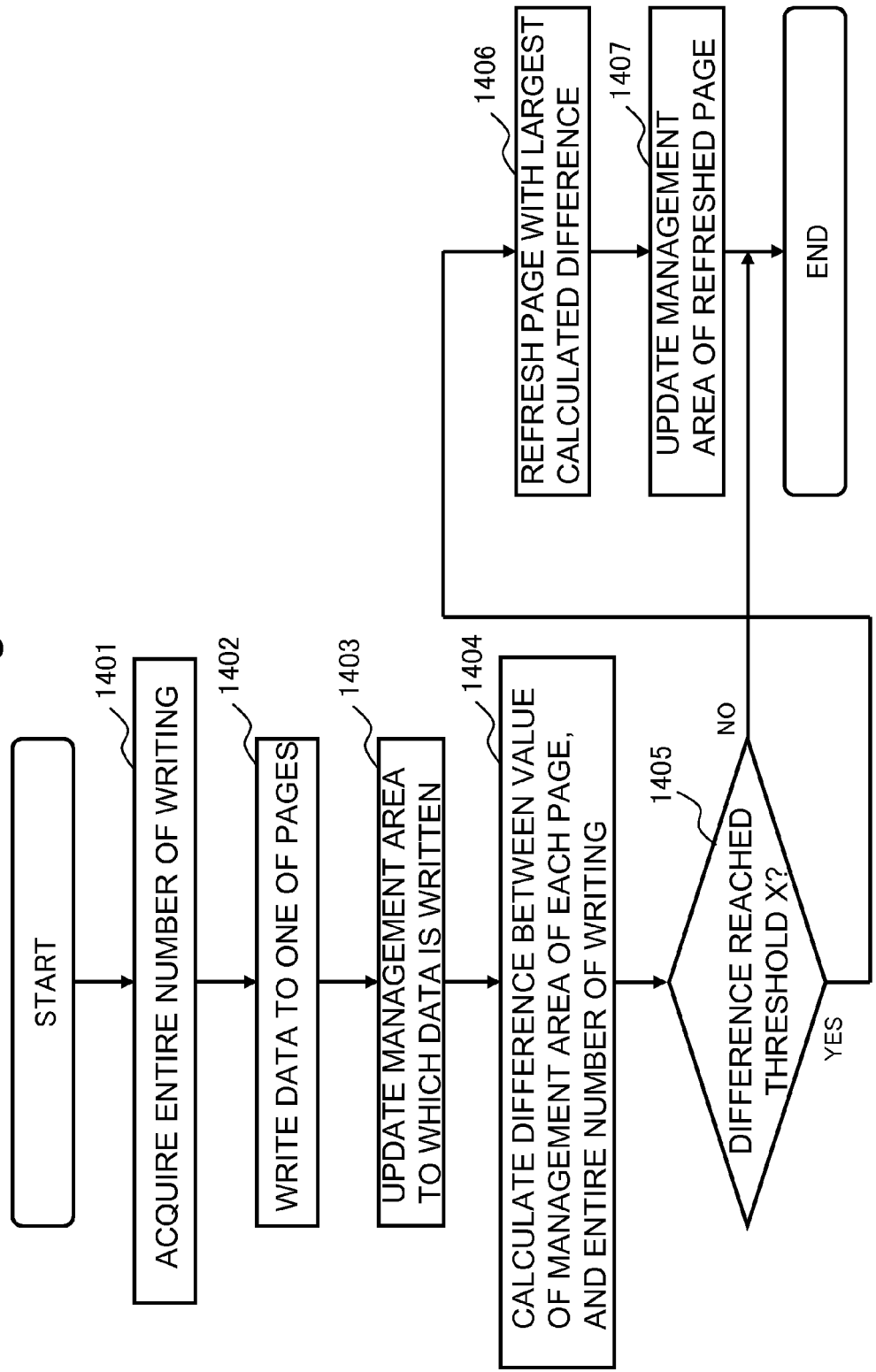

Fig.15A

| Page 1 | 0 |
| Page 2 | 0 |
| ... | ... |
| Page 150 | 0 |
| ... | ... |
| Page 300 | 0 |
| ... | ... |
| Page 511 | 0 |

INITIAL STATE

Fig.15B

| Page 1 | 0 |
| Page 2 | 0 |
| ... | ... |
| Page 150 | 1 |
| ... | ... |
| Page 300 | 0 |
| ... | ... |
| Page 511 | 0 |

1 TIME

Fig.15C

| Page 1 | 5000 |
| Page 2 | 1000 |
| ... | ... |
| Page 150 | 3340 |
| ... | ... |
| Page 300 | 2300 |
| ... | ... |
| Page 511 | 4300 |

5000 TIMES

Fig.15D

| Page 1 | 5000 |
| Page 2 | 5001 |
| ... | ... |
| Page 150 | 3340 |
| ... | ... |
| Page 300 | 5001 |
| ... | ... |
| Page 511 | 4300 |

5001 TIMES

Fig.17A

| Page 1 | ... | Page M | ... | Page N |
|---|---|---|---|---|
| MANAGEMENT AREA | | MANAGEMENT AREA | | MANAGEMENT AREA |

Fig.17B

| CONVERSION FLAG | ENTIRE NUMBER OF WRITING |
|---|---|

CONTROL METHOD FOR NONVOLATILE MEMORY AND SEMICONDUCTOR DEVICE

CLAIM OF PRIORITY

The present application claims priority from Japanese patent application JP 2008-205414 filed on Aug. 8, 2008, the content of which is hereby incorporated by reference into this application.

FIELD OF THE INVENTION

The present invention relates to refresh control technique in a nonvolatile memory, and specifically relates to technique which is effective when applied to a microcomputer provided with a nonvolatile memory, for example.

BACKGROUND OF THE INVENTION

With growing demands to a mass memory, a nonvolatile memory has been used widely. As a major factor which impedes realization of a large-capacity nonvolatile memory, there is increase of a chip cost due to increase of chip area. For reduction of the chip area of a nonvolatile memory, a MONOS single transistor memory is proposed (for example, refer to Patent Document 1). The MONOS single transistor memory is formed by one bit per one transistor (MONOS stands for Metal Oxide Nitride Oxide Semiconductor).
[Patent Document 1]
Japanese Unexamined Patent Publication No. 2006-185530

SUMMARY OF THE INVENTION

In a MONOS single transistor memory which is formed by one bit per one transistor, erasure, writing, and read-out can be performed to a selected bit by applying prescribed voltage as illustrated in FIG. 1A-FIG. 1D of Patent Document 1 to a memory gate (MG), a well, a source (S), and a drain (D). In this case, in order to prevent malfunction of a bit which is not selected (unselected bit), it is necessary to apply blocking voltage to the unselected bit. However, a study performed by the present inventors on the matter has revealed that, by application of the blocking voltage, the unselected bit is brought to a weak erasing state or writing state at the time of erasure, writing, and read-out; and consequently, a phenomenon (called "disturb") of changing threshold (Vth) of the memory cell is induced. As measures against the disturb, it may be possible to perform refresh by re-writing, for every writing, every read-out, or every erasure. If the refresh is performed for every writing, every read-out, or every erasure, it is likely that the number of writing of each page may increase undesirably by the refresh operation.

The purpose of the present invention is to provide technique for restoring the threshold to a state before changing in a nonvolatile memory, without increasing the number of writing undesirably.

The other purposes and the new feature of the present invention will become clear from the description of the present specification and the accompanying drawings.

The following is a brief explanation of typical one of the inventions disclosed in the present application.

That is, in a system including a nonvolatile memory, a random number generator, and a controller accessible to the nonvolatile memory, an area to be refreshed (refresh-targeted area) is determined by the controller, based on a random number generated by the random number generator, every time access to the nonvolatile memory is performed, and the controller is made perform refresh control of re-writing to the refresh-targeted area concerned. By such refresh control, the threshold can be restored to a state before changing, without increasing the number of writing undesirably.

A total number of access to all accessing target areas and a refresh-targeted area in the nonvolatile memory are managed, the total number of access to the nonvolatile memory is updated every time access to the nonvolatile memory is performed, and the controller is made perform refresh control of re-writing to the refresh-targeted area based on the result of the updating. Accordingly, it is possible to perform refresh uniformly to the accessing target area in the nonvolatile memory. By the refresh, the threshold of the memory cell can be restored to a state before changing.

The following explains briefly the effect acquired by the typical one of the inventions disclosed by the present application.

That is, in the nonvolatile memory, the threshold can be restored to a state before changing, without increasing the number of writing undesirably.

BRIEF DESCRIPTION OF THE DRAWINGS

These and other features, objects and advantages of the present invention will become more apparent from the following description when taken in conjunction with the accompanying drawings, wherein:

FIG. 1 is a block diagram of exemplified configuration of a microcomputer as an example of a semiconductor device according to the present invention;

FIG. 2 is an explanatory diagram of exemplified configuration of a nonvolatile memory included in the microcomputer illustrated in FIG. 1;

FIG. 3 is a flow chart of refresh control of the nonvolatile memory included in the microcomputer illustrated in FIG. 1;

FIG. 4 is a block diagram of another exemplified configuration of a microcomputer as an example of a semiconductor device according to the present invention;

FIG. 7 are explanatory diagrams of change of state of the nonvolatile memory included in the microcomputer illustrated in FIG. 4, in the refresh control;

FIG. 8 is a block diagram of another exemplified configuration of a microcomputer as an example of a semiconductor device according to the present invention;

FIG. 11 are explanatory diagrams of change of state in refresh control of the nonvolatile memory included in the microcomputer illustrated in FIG. 8;

FIG. 12 is a flow chart of another refresh control in the configuration illustrated in FIGS. 4 and 5;

FIG. 13 are explanatory diagrams of change of state in another refresh control in the configuration illustrated in FIGS. 4 and 5;

FIG. 14 is a flow chart of another refresh control in the configuration illustrated in FIGS. 8 and 9;

FIG. 15 are explanatory diagrams of change of state in another refresh control in the configuration illustrated in FIGS. 8 and 9;

FIG. 17 are explanatory diagrams of exemplified configuration of a refresh management area included in the microcomputer illustrated in FIG. 16;

FIG. 19 are explanatory diagrams of change of state of the nonvolatile memory included in the microcomputer illustrated in FIG. 16, in the refresh control;

DETAILED DESCRIPTION OF THE PREFERRED EMBODIMENTS

1. Typical Embodiment

Figure 5:
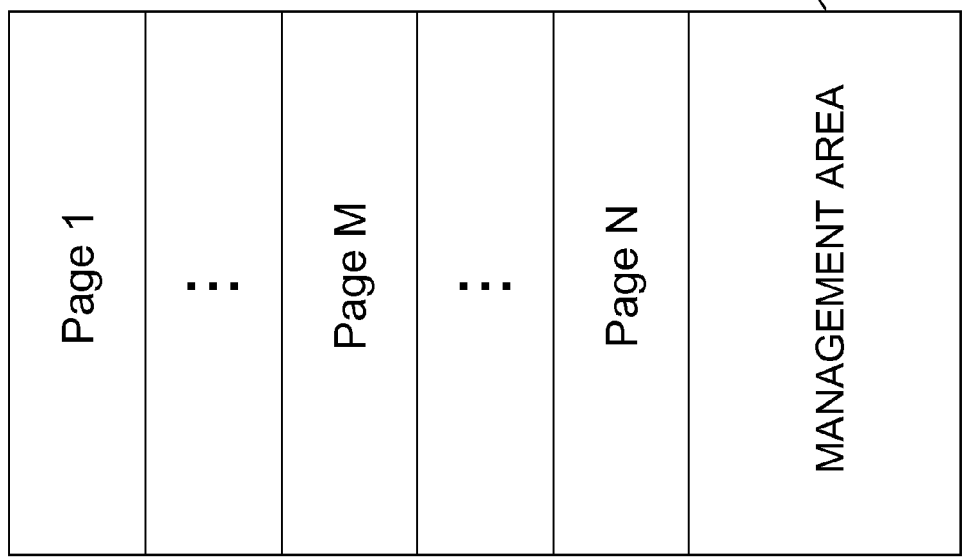
FIG. 5 is an explanatory diagram of exemplified configuration of a nonvolatile memory included in the microcomputer illustrated in FIG. 4.

First, an outline is explained on a typical embodiment of the invention disclosed in the present application. A reference symbol in parentheses referring to a component of the drawing in the outline explanation about the typical embodiment only illustrates what is included in the concept of the component to which the reference symbol is attached.

<1> A nonvolatile memory control method related to a typical embodiment of the present invention is practiced in a system which includes a nonvolatile memory (14), a random number generator (12) which can generate a random number, and a controller (15) which is coupled to the random number generator and can access the nonvolatile memory. That is, the controller is made perform refresh control to determine a refresh-targeted area based on a random number generated by the random number generator every time access to the nonvolatile memory is performed, and to re-write to the refresh-targeted area concerned.

According to such a control method, a refresh-targeted area is determined based on a random number generated by the random number generator, and re-writing to the area concerned is performed; accordingly, it is possible to perform refresh uniformly to each of the accessing target areas (Page 1-Page N) in the nonvolatile memory. By the refresh, the threshold of the memory cell can be restored to a state before changing. Since a random number is generated every time access to the nonvolatile memory is performed and re-writing is performed to an accessing target area corresponding to the random number, it is possible to avoid undesirable increase in the number of writing due to the refresh.

<2> The controller is made perform refresh control to manage a total number of access to all accessing target areas and a refresh-targeted area in the nonvolatile memory, to update the total number of access to the nonvolatile memory every time access to the nonvolatile memory is performed, and to re-write to the refresh-targeted area based on the result of the updating. Accordingly, the accessing target areas (Page 1-Page N) in the nonvolatile memory can be refreshed uniformly. By the refresh, the threshold of the memory cell can be restored to a state before changing.

<3> In Item <2>, the refresh control performed by the controller may include first processing (Step 602, Step 1001) for obtaining a total number of access to all accessing target areas in the nonvolatile memory, every time access to the nonvolatile memory is performed, second processing (Step 603, Step 1004) for comparing the total number obtained in the first processing with a prescribed threshold, third processing (Step 605, Step 1006) for performing re-writing to the refresh-targeted area according to the comparison result in the second processing, and fourth processing (Step 607, Step 1009) for updating the threshold according to need after the third processing.

<4> In Item <2>, the refresh control performed by the controller may include fifth processing (Step 1202, Step 1404) for obtaining difference between the total number of access to all accessing target areas in the nonvolatile memory and the number of access to every accessing target area in the nonvolatile memory, every time access to the nonvolatile memory is performed, sixth processing (Step 1203, Step 1405) for comparing the difference obtained in the fifth processing with a prescribed threshold, and seventh processing (Step 1204, Step 1406) for determining a refresh-targeted area depending on the difference obtained in the sixth processing and for performing re-writing in order to refresh the refresh-targeted area.

<5> In Item <2>, the refresh control performed by the controller may include eighth processing (Step 1804) for obtaining difference between the total number of access to all accessing target areas in the nonvolatile memory and the number of access to every accessing target area in the nonvolatile memory, every time access to the nonvolatile memory is performed, and ninth processing (Step 1806) for obtaining a first accessing target area corresponding to the difference smaller than a prescribed threshold, among the difference obtained in the eighth processing. The refresh control performed by the controller may include tenth processing (Step 1807) for determining whether interchange of a physical address to a logical address is possible between the first accessing target area obtained in the ninth processing and a second accessing target area different from the first accessing target area, and eleventh processing (Step 1808) for performing the interchange of the physical address to the logical address between the first accessing target area and the second accessing target area, when it is determined in the tenth processing that the interchange of the physical address to the logical address between the first accessing target area and the second accessing target area is possible. The refresh control performed by the controller may include further twelfth processing (Step 1810) for determining a refresh-targeted area according to the difference obtained in the eighth processing and for performing re-writing to refresh the refresh-targeted area, when it is determined in the tenth processing that the interchange of the physical address to the logical address is impossible.

<6> In Item <5>, the second accessing target area may be determined based on the difference obtained in the eighth processing.

<7> A semiconductor device (10) related to a typical embodiment of the present invention includes a nonvolatile memory (14). The semiconductor device comprises a random number generator (12) which generates a random number, and a controller (15) which determines a refresh-targeted area based on a random number generated by the random number generator and performs refresh control in order to re-write the refresh-targeted area concerned, every time access to the nonvolatile memory is performed.

<8> A semiconductor device (10) related to a typical embodiment of the present invention includes a nonvolatile memory (14). The semiconductor device comprises a management area (51) which manages a total number of access to all accessing target areas and a refresh-targeted area in the nonvolatile memory, and a controller (15) which updates the total number of access to the nonvolatile memory and performs refresh control in order to perform re-writing to the refresh-targeted area based on the updated result, every time access to the nonvolatile memory is performed.

<9> In Item <8>, the management area may be formed by a part of a storage area in the nonvolatile memory.

<10> In Item <8>, the management area is formed by a semiconductor memory provided separately from the nonvolatile memory.

<11> In Item <8>, the controller may be made perform processing including first processing (Step 602, Step 1001) for obtaining a total number of access to all accessing target areas in the nonvolatile memory, every time access to the nonvolatile memory is performed, second processing (Step 603, Step 1004) for comparing the total number of access obtained in the first processing with a prescribed threshold, third processing (Step 605, Step 1006) for performing re-writing to the refresh-targeted area according to the comparison result in the second processing, and fourth processing (Step 607, Step 1009) for updating the threshold according to need after the third processing.

<12> In Item <8>, the controller may be made perform processing including fifth processing (Step 1202, Step 1404) for obtaining difference between the total number of access to all accessing target areas in the nonvolatile memory and the number of access to every accessing target area in the nonvolatile memory, every time access to the nonvolatile memory is performed, sixth processing (Step 1203, Step 1405) for comparing the difference obtained in the fifth processing with a prescribed threshold, and seventh processing (Step 1204, Step 1406) for determining a refresh-targeted area depending on the difference obtained in the sixth processing and for performing re-writing in order to refresh the refresh-targeted area.

<13> In Item <8>, the semiconductor device further includes a logical address/physical address conversion table (17) which converts a logical address given externally to a physical address in the nonvolatile memory. The controller may be made perform processing including eighth processing (Step 1804) for obtaining difference between the total number of access to all accessing target areas in the nonvolatile memory and the number of access to every accessing target area in the nonvolatile memory, every time access to the nonvolatile memory is performed, and ninth processing (Step 1806) for obtaining a first accessing target area corresponding to the difference smaller than a prescribed threshold, among the difference obtained in the eighth processing. The controller may be made further perform tenth processing (Step 1807) for determining whether interchange of a physical address to a logical address is possible between the first accessing target area obtained in the ninth processing and a second accessing target area different from the first accessing target area, and eleventh processing (Step 1808) for performing the interchange of the physical address to the logical address between the first accessing target area and the second accessing target area, when it is determined in the tenth processing that the interchange of the physical address to the logical address between the first accessing target area and the second accessing target area is possible. The controller may be made perform twelfth processing (Step 1810) for determining a refresh-targeted area according to the difference obtained in the eighth processing and for performing re-writing to refresh the refresh-targeted area, when it is determined in the tenth processing that the interchange of the physical address to the logical address is impossible.

<14> The accessing target area serves as a "sector" when the nonvolatile memory is accessed in units of sectors, serves as a "page" when the nonvolatile memory is accessed in units of pages, and serves as a "block", when the nonvolatile memory is accessed in units of blocks. Access for writing to the nonvolatile memory, access for erasure of the nonvolatile memory, and access for read-out from the nonvolatile memory are included in the access.

2. Explanation of Embodiment

Next, embodiment is explained further in full detail.

Embodiment 1

FIG. 1 illustrates exemplified configuration of a microcomputer as an example of a semiconductor device according to the present invention. Although not restricted in particular, the microcomputer 10 illustrated in FIG. 1 includes a processor 11, a random number generator 12, a program memory 13, a nonvolatile memory 14, and an access controller 15, and is formed over one semiconductor substrate, such as a single crystal silicone substrate, by a publicly known semiconductor integrated circuit manufacturing technology. The processor 11, the random number generator 12, the program memory 13, and the nonvolatile memory 14 are coupled via a bus 9, so that mutual communication of various signals is possible. The nonvolatile memory 14 is a MONOS single transistor memory which has the structure of one bit per one transistor, for example (MONOS stands for Metal Oxide Nitride Oxide Semiconductor).

Figure 2:
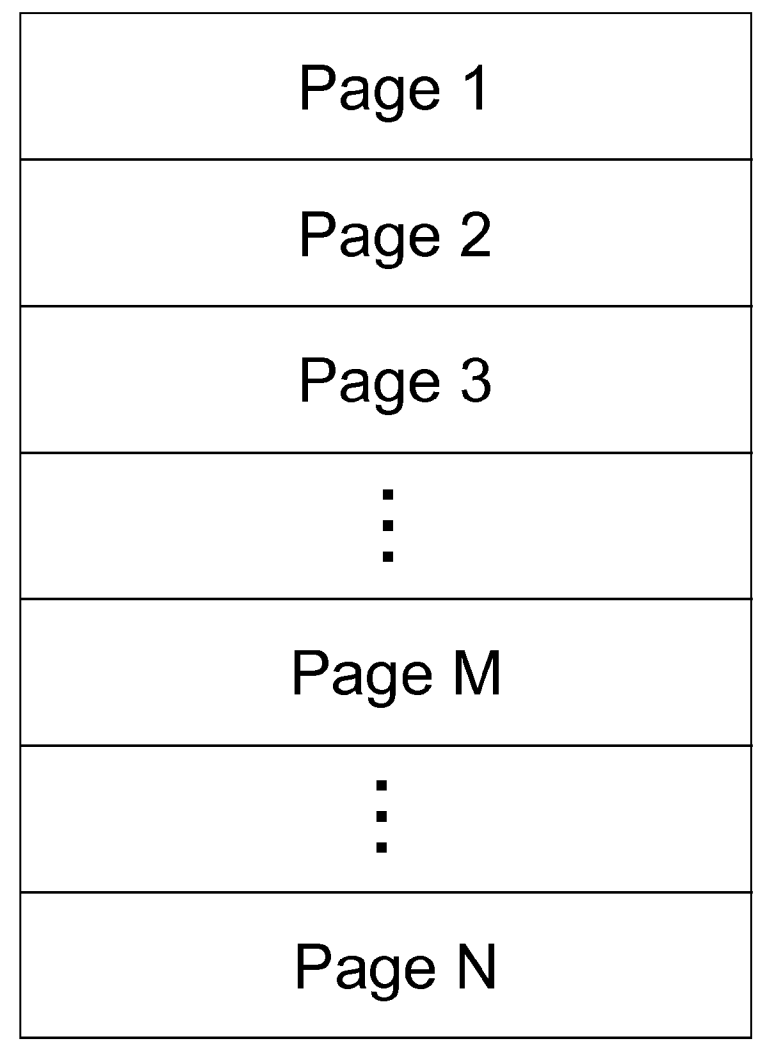
Figure 20A:
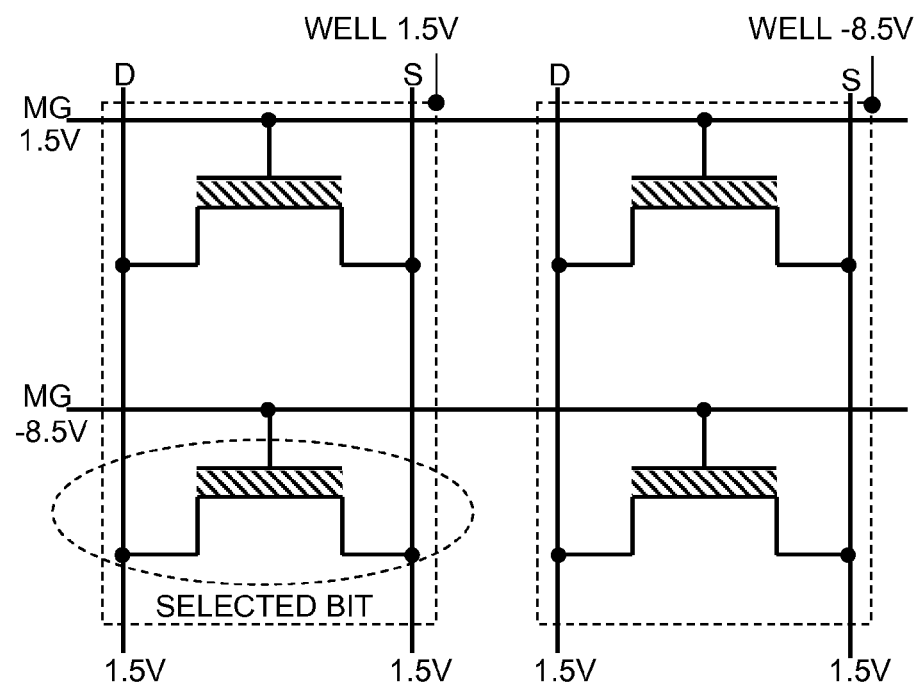
FIG. 20A is an explanatory diagram of configuration of a principal part of the nonvolatile memory and voltage application.
Figure 20B:
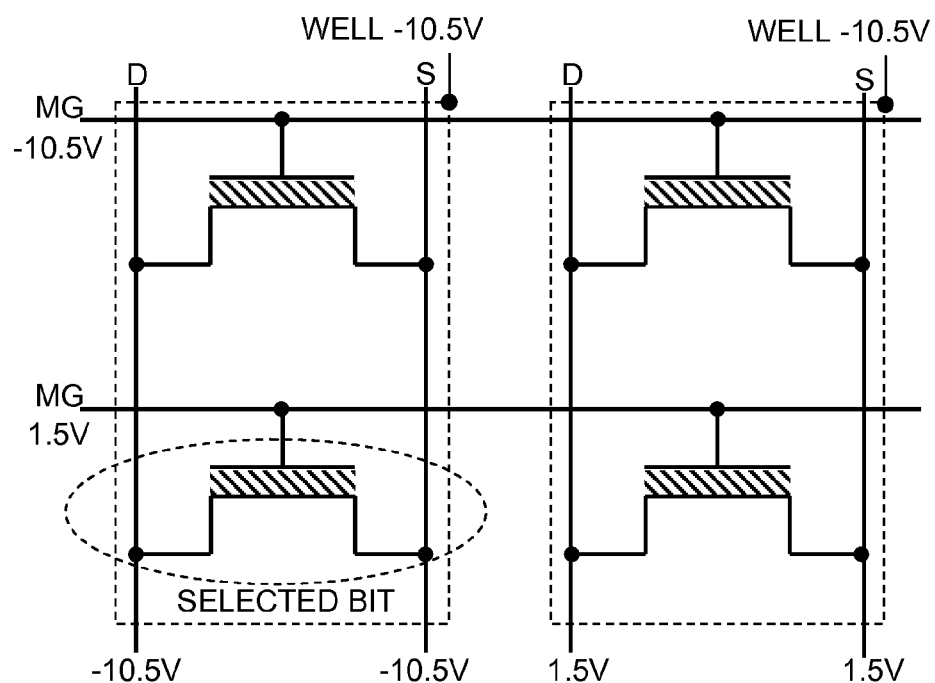
FIG. 20B is an explanatory diagram of configuration of a principal part of the nonvolatile memory and voltage application.
Figure 20C:
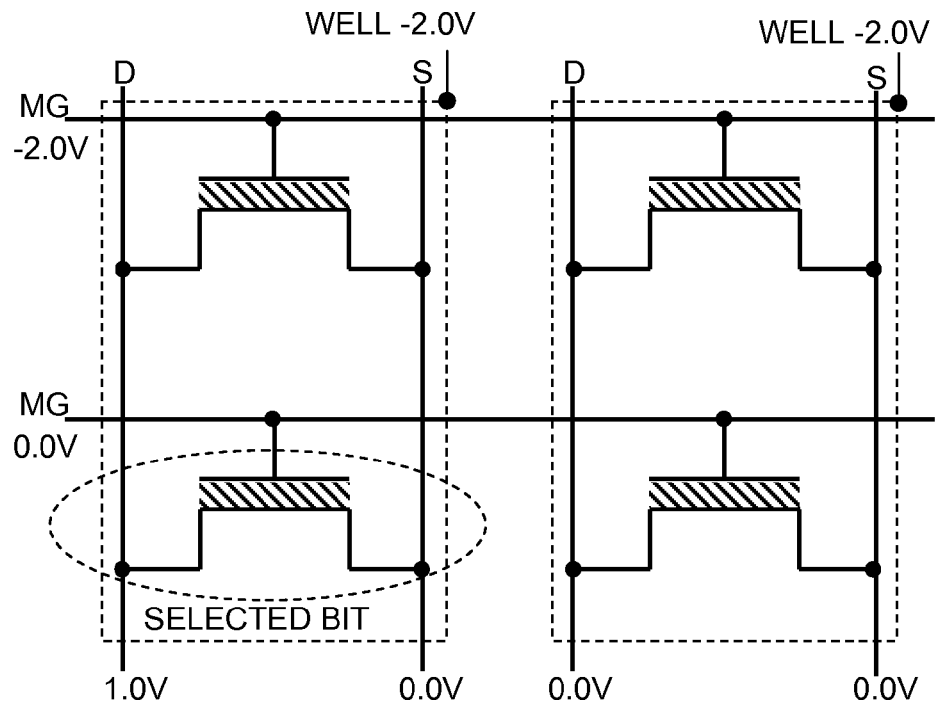
FIG. 20C is an explanatory diagram of configuration of a principal part of the nonvolatile memory and voltage application.
Figure 20D:
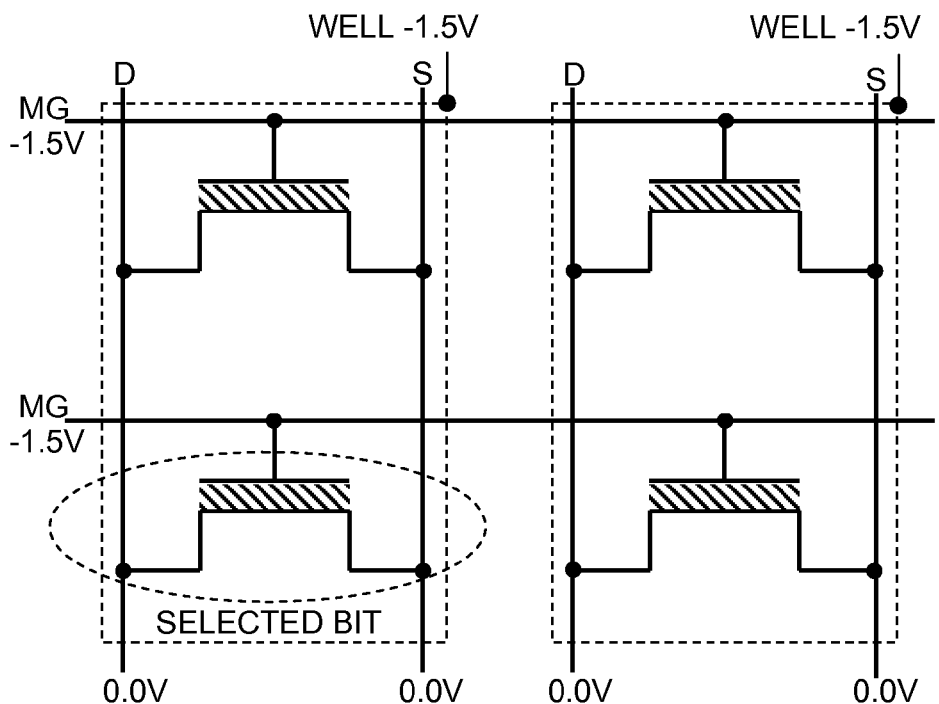
FIG. 20D is an explanatory diagram of configuration of a principal part of the nonvolatile memory and voltage application.

The nonvolatile memory 14 possesses plural nonvolatile memory cells arranged in the shape of an array. The processor 11 stores various data used for processing. The nonvolatile memory 14 is comprised of plural blocks, and each block is comprised of plural pages, Page 1-Page N, as illustrated in FIG. 2. Writing, erasure, and read-out are performed in units of the pages. A predetermined operating bias is applied in each mode, such as writing, erasure, and read-out. For example, as illustrated in FIG. 20A, at the time of erasure, by applying −8.5V to a memory gate (MG), 1.5V or the power supply voltage to a well, a source (S), and a drain (D), an electron in a nitride film is extracted to the well side by tunnel effect; accordingly, a threshold (Vth) of the memory cell is set to the minus polarity. As illustrated in FIG. 20B, at the time of writing, by applying 1.5V to the memory gate (MG) and −10.5V to the well, the source (S), and the drain (D), an electron is injected into a nitride film by tunnel effect; accordingly the threshold (Vth) of the memory cell is set to plus polarity. As illustrated in FIG. 20C, at the time of read-out, by setting 0V to the memory gate (MG) to select, 0V to the source (S), and 1.0V to the drain (D), the threshold (Vth) becomes minus polarity when the memory cell is in an erasing state; therefore, current flows between the drain (D) and the sources (S), accordingly the fact that the drain potential falls is detected. On the contrary, the threshold (Vth) becomes plus polarity when the memory cell is in a writing state; therefore, current does not flow between the drain (D) and the sources (S), accordingly the fact that the drain potential is kept at 1V is detected. As illustrated in FIG. 20D, at the time of standby, −1.5V which is below the memory erasure threshold (Vth) is applied to the memory gate (MG) and the well.

Erasure, writing, and read-out can be performed to a selected bit by applying prescribed voltage as illustrated in FIG. 20A-FIG. 20D to the memory gate (MG), the well, the source (S), and the drain (D). In this case, in order to prevent malfunction of a bit which is not selected (unselected bit), it is necessary to apply blocking voltage to the unselected bit. However, by application of the blocking voltage, the unselected bit is brought to a weak erasing state or writing state at the time of erasure, writing, and read-out, and consequently, a phenomenon "disturb" in which a threshold (Vth) of the memory cell changes is induced. As measures against the disturb, it is possible to perform refresh by re-writing, for every writing, every read-out, or every erasure. If the refresh is performed for every writing, every read-out, or every erasure, it is likely that the number of writing of each page may increase undesirably by the refresh operation. Accordingly, in the present embodiment, the refresh is performed as follows.

The random number generator 12 generates an intrinsic random number, i.e., a random number which does not have non-uniformity in an appearing number. The processor 11 performs a predetermined arithmetic processing according to a predetermined program. The processor 11 manages operation control of the entire microcomputer 10. Although refresh control of the nonvolatile memory 14 can be performed by the processor 11 and the access controller 15 in the present embodiment, it is assumed in the present explanation that the refresh control is performed by the access controller 15. In the refresh control by the access controller 15, every time writing to the nonvolatile memory 14 is performed, a refresh-targeted page is determined based on a random number generated by the random number generator 12, and re-writing is performed to the page concerned.

Here, the maximum of a random number generated by the random number generator 12 is assumed to be a sufficiently larger value than the total number of pages N in the nonvolatile memory 14. This is because, in the refresh control according to the present embodiment, it is determined whether or not a generated random number is within a range (1-N), and when the generated random number is within the range (1-N), the re-writing for refresh is performed. If the maximum of a random number generated by the random number generator 12 is assumed to be a value smaller than the total number of pages N in the nonvolatile memory 14, the re-writing for refresh will be performed every time a random number is generated, resulting in frequent refreshing more than needed.

The program memory 13 stores a program executed by the processor 11.

FIG. 3 illustrates a flow of the refresh control.

The processor 11 requests the access controller 15 to write data to one of pages, for example, to Page M. When the access controller 15 writes data in Page M (301), the access controller 15 further requests the random number generator 12 to generate a random number X (302), and the access controller 15 determines whether or not a value of the generated random number X is within the range (1-N) (303). When it is determined that the value of the generated random number is within the range (1-N) (YES), the access controller 15 performs refresh by performing re-writing to the page (Page X) corresponding to the random number. For example, when the value of the generated random number is "3", refresh to Page 3 is performed. In this way, according to the present embodiment, every time data is written in one of pages of the nonvolatile memory 14, an intrinsic random number is generated by the random number generator 12, and re-writing is performed to the page corresponding to the intrinsic random number. Since there is no non-uniformity in an appearing number of the intrinsic random number, refresh can be performed uniformly to each page (Page 1-Page N) of the nonvolatile memory 14. The threshold of the memory cell is restored to a state before changing by the present refresh. When the nonvolatile memory 14 is comprised of plural blocks and each block is comprised of plural pages (Page 1-Page N), the refresh control by the processor 11 is performed similarly to the other block concerned.

According to the example, the following working-effects can be obtained.

(1) Every time data is written in one of pages of the nonvolatile memory 14, an intrinsic random number is generated by the random number generator 12, and re-writing is performed to a page corresponding to the intrinsic random number. Therefore, each page (Page 1-Page N) of the nonvolatile memory 14 can be refreshed uniformly. Accordingly, the threshold of the memory cell is restored to a state before changing by the present refresh.

(2) Improvement in the reliability of the microcomputer 10 can be promoted by the working-effect (1).

(3) In the nonvolatile memory 14, if the refresh is performed for every writing, every read-out, or every erasure, it is likely that the number of writing of each page may increase undesirably by the refresh operation. However, as described above, every time data is written in one of pages of the nonvolatile memory 14, an intrinsic random number is generated by the random number generator 12, and re-writing is performed to the page corresponding to the intrinsic random number. Therefore, it is possible to avoid undesirable increase in the number of writing due to the refresh.

Embodiment 2

FIG. 4 illustrates another exemplified configuration of a microcomputer as an example of a semiconductor device according to the present invention. The microcomputer 10 illustrated in FIG. 4 is greatly different from the counterpart illustrated in FIG. 1 in the points that the random number generator 12 is omitted and a management area about the refresh is secured in the nonvolatile memory 14, in lieu of the omitted random number generator 12. In the present embodiment, the access controller 15 performs refresh control based on management information stored in the management area. As illustrated in FIG. 5, for example, the nonvolatile memory 14 is provided with a management area 51 besides Page 1-Page N. In the management area 51, a total value of the number of writing for all the pages in the nonvolatile memory 14 (it is called an "entire number of writing") and information for specifying a page targeted as refresh (refresh-targeted page) are set up. Each information in the management area 51 is updated by the access controller 15.

Figure 6:
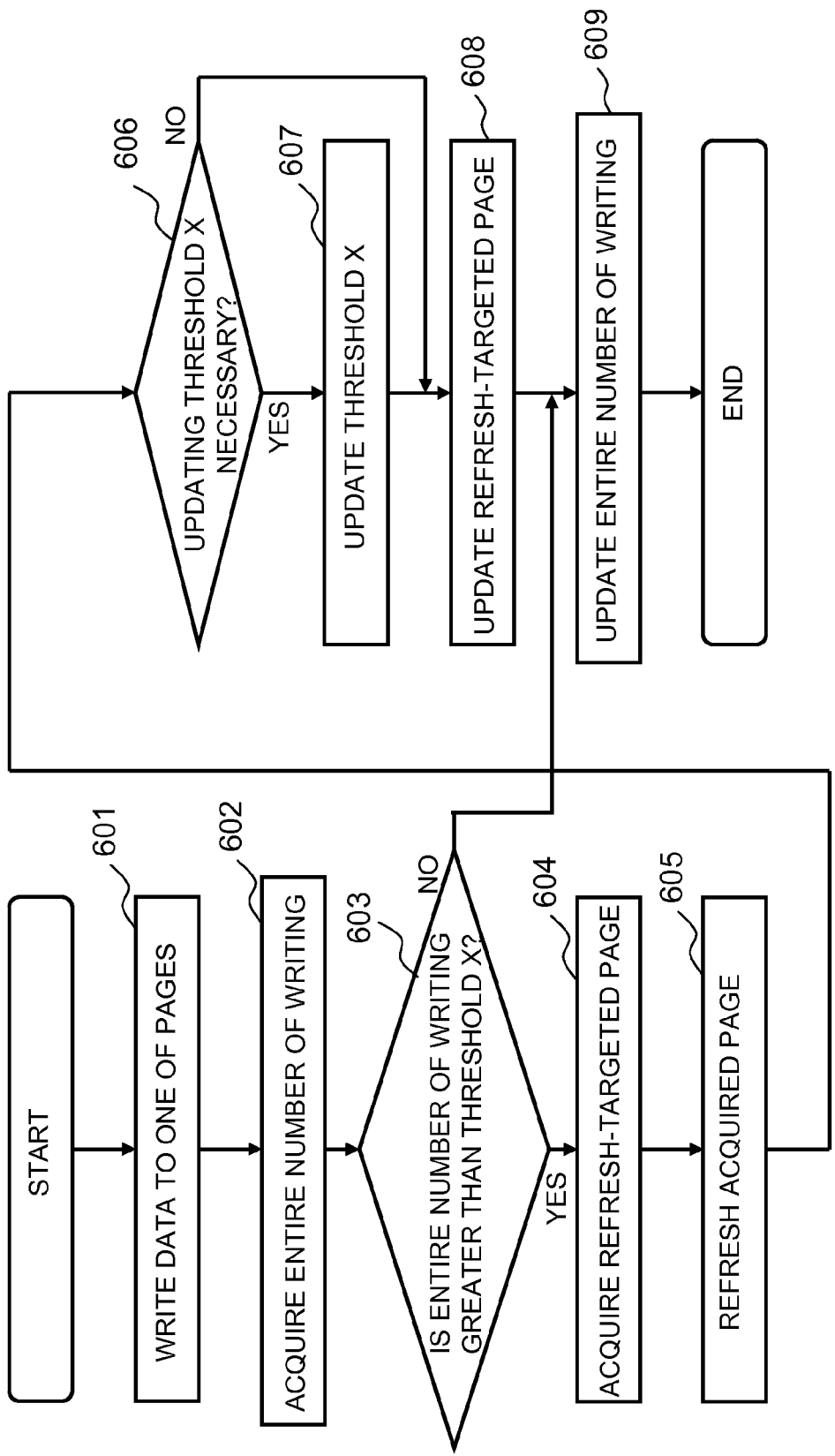
FIG. 6 is a flow chart of refresh control of the nonvolatile memory included in the microcomputer illustrated in FIG. 4.

FIG. 6 illustrates an entire flow of refresh control in the microcomputer 10 illustrated in FIG. 4. Although the refresh control can be performed by the processor 11 and the access controller 15, it is assumed in the present explanation that the refresh control is performed by the access controller 15. FIG. 7 illustrates change of state of the nonvolatile memory 14 in the refresh control. In FIG. 7, a hatched area means a page to which writing is performed, and an underlined page number means a page to which refresh is performed.

The state illustrated in FIG. 7A is assumed to be an initial state. In the initial state, the entire number of writing is set to "0", and the refresh-targeted page is set to "Page 1." The threshold X is set to "10000." Now, consideration is given to a case where writing of data to the nonvolatile memory 14 is performed in the present state, under the control of the access controller 15. It is assumed that writing of data is performed, for example to Page 2 in the nonvolatile memory 14, under the control of the access controller 15 (Step 601). After the present writing is completed, the entire number of writing of the nonvolatile memory 14 is obtained by the processor 11 by referring to the management area 51 (Step 602). The processor 11 determines whether or not the entire number of writing is greater than the threshold X (Step 603). The threshold X is set to a proper register, etc. in the processor 11. In the determination at Step 603, when it is determined that the entire number of writing is not greater than the threshold X (NO), the entire number of writing is updated under the control of the access controller 15 (Step 609). For example, in the initial state illustrated in FIG. 7A, the entire number of writing is "0", and it is not greater than the threshold X; accordingly, it is determined as "NO" in the determination at Step 603, and the entire number of writing is updated (Step 609). In an example illustrated in FIG. 7B, the entire number of writing is updated from "0" to "1." Similarly, in the state illustrated in FIG. 7C, writing of data to Page 300 is performed. At this time, the entire number of writing is "9999." In the state illustrated in FIG. 7D, writing of data to Page 150 is performed. At this time, the entire number of writing is "10000." In the state illustrated in FIG. 7E, writing of data to Page 511 is performed. At this time, the entire number of writing becomes "10001", and exceeds the threshold X=10000 at that time. In this state, it is determined as "YES" at Step 603. When it is determined as "YES" at Step 603, information on the refresh-targeted page is obtained from the management area 51. It is determined whether or not refresh is necessary (Step 604). For example, when writing to the refresh-targeted page obtained at Step 604 is performed at Step 601, re-writing for refresh to the refresh-targeted page concerned is unnecessary. Therefore, the refresh-targeted page obtained at Step 604 and the page to which writing is performed at Step 601 are compared. When both pages are same, it is determined that refresh to the page concerned is unnecessary, and when both pages are different, it is determined that refresh to the page concerned is necessary. When it is determined that refresh is necessary at Step 604, refresh, i.e., re-writing, to the corresponding page (in this case, Page 1) is performed (Step 605). Subsequently, it is determined whether it is necessary to update the threshold X in the relations with the entire number of writing (Step 606). When it is determined that refresh is unnecessary at Step 604, the determination at Step 607 is performed without performing refresh at Step 605.

When the entire number of writing exceeds the threshold X, the determination at Step 606 is "YES", and as a result, the threshold X is updated to a larger value than the value until that moment (Step 607). If the value of the threshold X is not updated to a larger value than the value until that moment, every time writing to one of pages is performed, the determination at Step 604 becomes always "refresh is necessary" and refresh is performed, leading to unnecessarily frequent re-writing. In order to avoid such a situation, when the entire number of writing exceeds the threshold X, the control is designed such that the determination at Step 606 becomes "YES", and that the threshold X is updated consequently to a larger value than the value until that moment (Step 607). After the threshold X is updated, the refresh-targeted page is updated (Step 608) and then the entire number of writing is updated (Step 609). When updating of the threshold X is not necessary in the relations with the entire number of writing, the determination at Step 606 becomes "NO", and the refresh-targeted page is updated (Step 608) without updating the threshold X, and then the entire number of writing is updated (Step 609). In an example illustrated in FIG. 7E, the entire number of writing is set to "10001", and a refresh-targeted page is updated to "Page 2." Therefore, when writing of data to Page 511 is performed, the determination at Step 603 becomes "YES", and refresh of Page 2 will be performed at Step 605.

According to the example, the following working-effects can be obtained.

(1) Whenever data is written in one of pages in the nonvolatile memory 14, it is determined whether or not the entire number of writing is greater than a threshold (Step 603). When the entire number of writing is greater than the threshold, a page acquired as a refresh-targeted page is refreshed. Then the threshold X is updated in the relations with the entire number of writing (Step 609). By such refresh control, each page (Page 1-Page N) in the nonvolatile memory 14 can be refreshed uniformly. Accordingly, the threshold of the memory cell is restored to a state before changing by the present refresh.

(2) Improvement in the reliability of the microcomputer 10 can be promoted by the working-effect (1).

(3) If the refresh is performed for every writing, every read-out, or every erasure in the nonvolatile memory 14, it is likely that the number of writing of each page may increase undesirably by the refresh operation. However, every time data is written in one of pages in the nonvolatile memory 14 as described above, it is determined whether or not the entire number of writing is greater than a threshold (Step 603), and when the entire number of writing is greater than the threshold, a page acquired as a refresh-targeted page is refreshed. Therefore, it is possible to avoid undesirable increase in the number of writing due to the refresh.

Embodiment 3

Figure 9A:
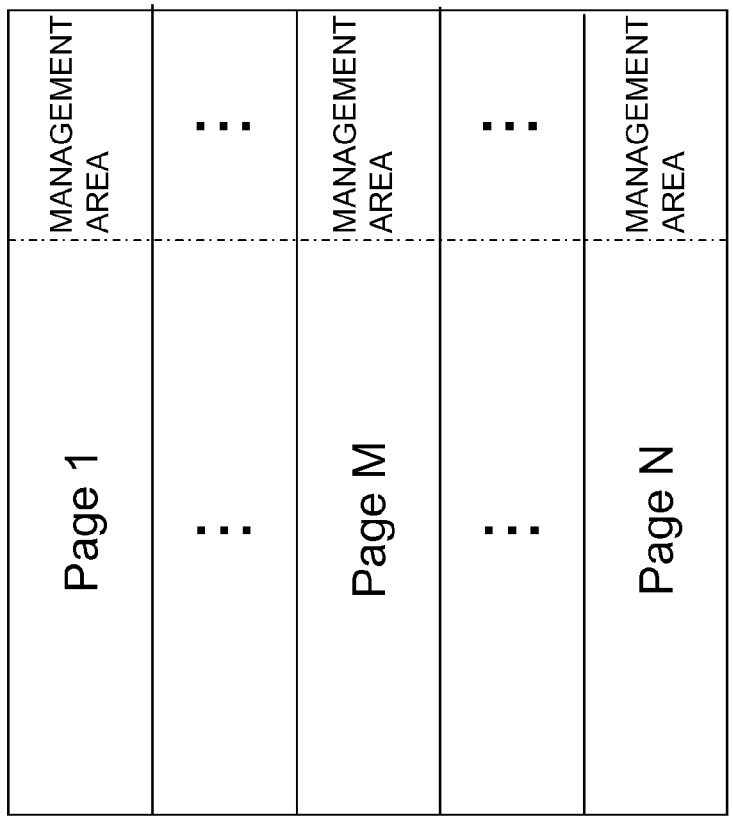
FIG. 9 are explanatory diagrams of exemplified configuration of a refresh management area included in the microcomputer illustrated in FIG. 8.
Figure 9B:

FIG. 8 illustrates another exemplified configuration of a microcomputer as an example of a semiconductor device according to the present invention. The microcomputer 10 illustrated in FIG. 8 is greatly different from the counterpart illustrated in FIG. 4 in the point that a management area about refresh is secured in each page of the nonvolatile memory 14 and in the point that the refresh management area 16 is formed externally. The refresh management area 16 is formed in RAM (random access memory) etc. which is coupled to the bus 9. The nonvolatile memory 14 possesses a management area which is provided for every page, as illustrated in FIG. 9A, for example. The management area includes a storage area of a refresh flag and an entire number of writing, as illustrated in FIG. 9B. The refresh flag indicates whether refresh has been performed or not. For example, the refresh flag of a logical value "0" indicates that refresh is not yet performed, and the refresh flag of a logical value "1" indicates that refresh has been performed. The refresh management area 16 stores the entire number of writing and the refresh-targeted page which are acquired by searching the management area at the time of power-on. By providing the refresh management area 16, it becomes possible to save labor in searching the entire number of writing and the refresh-targeted page at every memory access.

Figure 10:
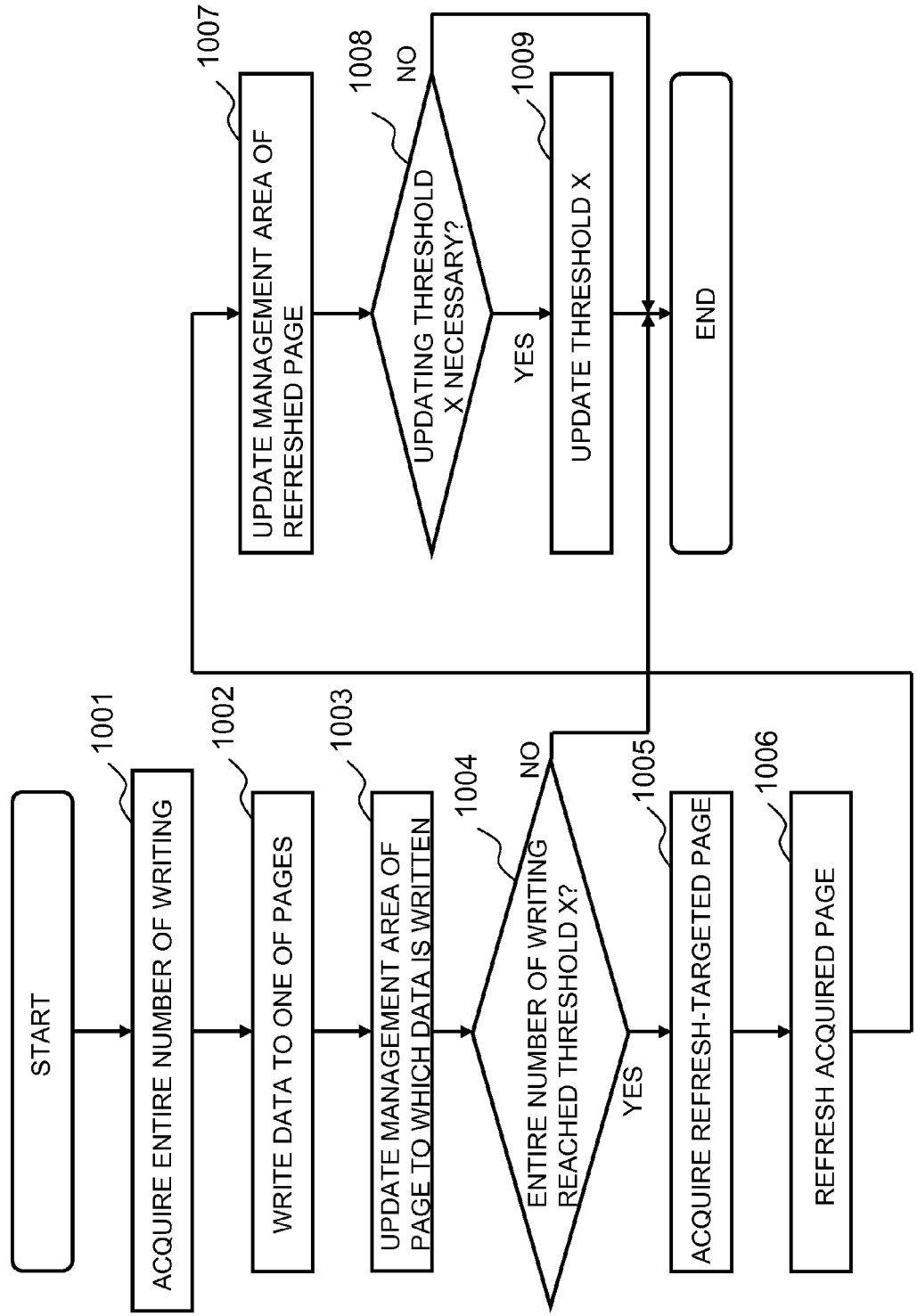
FIG. 10 is a flow chart of refresh control of the nonvolatile memory included in the microcomputer illustrated in FIG. 8.

FIG. 10 illustrates an entire flow of refresh control in the microcomputer illustrated in FIG. 8. Although the refresh control can be performed by the processor 11 and the access controller 15, it is assumed in the present explanation that the refresh control is performed by the access controller 15. FIG. 11 illustrates change of state of the nonvolatile memory 14 in the refresh control. In FIG. 11, a hatched area means a page to which writing is performed, and an underlined page number means a page to which refresh is performed.

The state illustrated in FIG. 11A is assumed to be an initial state. In the initial state, in all the pages (for example, Page 1-Page 511), the refresh flag is set to a logical value "0", and the entire number of writing is set to "0", respectively. The threshold X is set to "10000."

First, the refresh management area 16 is referred to by the access controller 15, and the entire number of writing in the nonvolatile memory 14 is acquired (Step 1001). When writing of data is performed to one of pages in the nonvolatile memory 14 under the control of the access controller 15 (Step 1002), the management area of the page concerned is also updated (Step 1003). Then, it is determined whether or not the entire number of writing has reached the threshold X (Step 1004). In the determination, when it is determined that the entire number of writing has not reached the threshold X (NO), processing is completed. For example, as illustrated in FIG. 11B, when data is written to Page 2, the management area of Page 2 is also updated. In an example illustrated in FIG. 11B, writing of data to other pages than Page 2 is not performed, therefore, the entire number of writing in the nonvolatile memory 14 is updated to "1" from "0" until that moment. In an example illustrated in FIG. 11C, when writing of data to Page 300 is performed, writing of data to the other pages has already been performed at this time, and the entire number of writing in the nonvolatile memory 14 is updated to "9999." In an example illustrated in FIG. 11D, writing of data is performed to Page 150. With the writing of data to Page 150, the entire number of writing in the nonvolatile memory 14 is set to "10000" and reaches the threshold X=10000 at that time. In the determination at Step 1004, it is determined as "YES" and a refresh-targeted page is acquired. It is determined whether refresh is necessary or not (Step 1005). For example, when writing to the refresh-targeted page obtained at Step 1005 has been performed at Step 1002, re-writing for refresh to the refresh-targeted page concerned is unnecessary. Therefore, the refresh-targeted page obtained at Step 1005 and the page to which writing has been performed at Step 1002 are compared. When the two pages are same, it is determined that refresh to the page concerned is unnecessary, and when the two pages are different, it is determined that refresh to the page concerned is necessary. When it is determined that refresh is necessary, refresh, i.e., re-writing, to the corresponding page (in this case Page 1) is performed (1006). The refresh flag in the management area is referred to at the time of power-on, a page possessing the refresh flag of a logical value "0" is stored in the refresh management area 16 as a refresh-targeted page. When there are plural refresh-targeted pages, a page of the smallest page number in the plural pages is selected. Then, updating of the refresh management area 16 and updating of the management area of the refreshed page are performed (Step 1007). For example, in an example illustrated in FIG. 11D, refresh of Page 1 is performed and the refresh flag corresponding to the page is updated to a logical value "1" from a logical value "0" until that moment. In an example illustrated in FIG. 11E, with writing of data to Page 511, the entire number of writing in the nonvolatile memory 14 is set to "10001" and exceeds the threshold X=10000 at that time. Therefore, in the determination at Step 1004, it is determined as "YES" and a refresh-targeted page is acquired (Step 1005). In this example, the refresh flag of Page 1 is set to a logical value "1", and the refresh is already completed. Therefore, refresh to Page 2 is performed (Step 1006), and the refresh flag corresponding to Page 2 is updated to a logical value "1" from a logical value "0" until that moment (Step 1007). In this way, every time writing of data to one of pages is performed, it is determined whether or not the entire number of writing reaches the threshold X (Step 1004), and refresh is performed based on the determination result (Step 1006). Then, it is determined whether or not it is necessary to update the threshold X (Step 1008). When all the refresh flags corresponding to Page 1-Page 511 become a logical value "1", it is determined that it is necessary to update the threshold X (YES), and the threshold X is updated to, for example, "30000" from "10000" until that moment (Step 1009), and the management area is restored to the initial state. Then, the refresh control illustrated in FIG. 10 is started again.

According to the example, the following working-effects can be obtained.

(1) Every time writing of data to one of pages is performed, it is determined whether the entire number of writing has reached the threshold X (Step 1004), and refresh is performed based on the determination result (Step 1006). Then, it is determined whether or not it is necessary to update the threshold X (Step 1008). The threshold X is updated when all the refresh flags corresponding to Page 1-Page 511 become a logical value "1." By such refresh control, each page (Page 1-Page N) of the nonvolatile memory 14 can be refreshed uniformly. Accordingly, the threshold of the memory cell is restored to a state before changing by the present refresh.

(2) Improvement in the reliability of the microcomputer 10 can be promoted by the working-effect (1).

(3) If the refresh is performed for every writing, every read-out, or every erasure in the nonvolatile memory 14, it is likely that the number of writing of each page may increase undesirably by the refresh operation. However, since it is determined whether the entire number of writing has reached the threshold X as described above (Step 1004) and the refresh is performed based on the determination result (Step 1006), it is possible to avoid undesirable increase in the number of writing due to the refresh.

Embodiment 4

FIG. 12 is an entire flow of another refresh control in the configuration illustrated in FIGS. 4 and 5.

The entire number of writing in the nonvolatile memory 14 and the entire number of writing recorded at the time of writing to each page being performed are stored in the management area 51 illustrated in FIG. 5, and refresh control is performed by the processor 11 and the access controller 15 based on the entire number of writing. In the present explanation, it is assumed that the refresh control is performed by the access controller 15. FIG. 13 illustrates change of state of the nonvolatile memory 14 in the refresh control. In FIG. 13, a hatched area means a page to which writing is performed, and an underlined page number means a page to which refresh is performed.

The state illustrated in FIG. 13A is assumed to be an initial state. In the initial state, the entire number of writing is set to "0", and the entire number of writing recorded at the time of writing to each page is set to "0." The threshold X is set to "4000." Now, consideration is given to a case where writing of data to the nonvolatile memory 14 is performed in the present state, under the control of the access controller 15.

First, when writing of data is performed to one of pages (Step 1201), the access controller 15 calculates difference between the entire number of writing of the nonvolatile memory 14 and the entire number of writing recorded at the time of writing to each page, with reference to the management area 51 illustrated in FIG. 5 (Step 1202). For example, as illustrated in FIG. 13B, when writing of data is performed to Page 150 (Step 1201), the number of writing of data to Page 150 is "1" and the number of writing of data to the other pages is "0." Accordingly, the entire number of writing of the nonvolatile memory 14 is set to "1" at this time.

Then, it is determined whether the difference between the entire number of writing of the nonvolatile memory 14 and the entire number of writing recorded at the time of writing to each page has reached the threshold X (Step 1203). When it is determined that the difference has not reached the threshold X (NO), the entire number of writing of the nonvolatile memory 14 and the entire number of writing recorded to a page to which writing is performed are updated (Step 1206). When it is determined at Step 1203 that the difference has reached the threshold X (YES), a page with the largest difference among the calculated difference is refreshed (Step 1204). In an example illustrated in FIG. 13C, the entire number of writing recorded to Page 1 is set to "5000", the entire number of writing recorded to Page 2 is set to "1000", the entire number of writing recorded to Page 150 is set to "3340", the entire number of writing recorded to Page 300 is set to "2300", the entire number of writing recorded to Page 511 is set to "4300", and the entire number of writing of the nonvolatile memory 14 is set to "5000." The difference between the entire number of writing recorded to Page 2 of "1000" and the entire number of writing of the nonvolatile memory 14 of "5000" becomes "4000." Since the present difference has reached the threshold X=4000, it is determined as "YES" in the determination at Step 1203, a page possessing the largest difference (Page 2 in the present case) is refreshed (Step 1204). The above described scheme is adopted since the page possessing the largest difference possesses least number of writing and needs to undergo measures against disturb in preference to the other pages. As illustrated in FIG. 13D, the entire number of writing recorded to the page to which writing is performed, the entire number of writing recorded to the page to which refresh is performed, and the entire number of writing of the nonvolatile memory 14 are updated (Step 1205).

According to the example, the following working-effects can be obtained.

(1) Every time data is written in one of pages in the nonvolatile memory 14, the difference between the entire number of writing of the nonvolatile memory 14 and the entire number of writing recorded at the time of writing to each page is calculated (Step 1202). It is determined whether the difference between the entire number of writing and the entire number of writing recorded at the time of writing to each page has reached the threshold X (Step 1203). When it is determined at Step 1203 that the difference has reached the threshold X (YES), a page possessing the largest difference among the calculated difference is refreshed (Step 1204). Therefore, each page (Page 1-Page 511) of the nonvolatile memory 14 can be refreshed uniformly. Accordingly, the threshold of the memory cell is restored to a state before changing by the present refresh.

(2) Improvement in the reliability of the microcomputer 10 can be promoted by the working-effect (1).

(3) If the refresh is performed for every writing, every read-out, or every erasure in the nonvolatile memory 14, it is likely that the number of writing of each page may increase undesirably by the refresh operation. However, when the difference between the entire number of writing of the nonvolatile memory 14 and the entire number of writing recorded at the time of writing to each page is calculated and when it is determined that the difference has reached the threshold X (YES), a page possessing the largest difference among the calculated difference is refreshed. Accordingly, it is possible to avoid undesirable increase in the number of writing due to the refresh.

Embodiment 5

FIG. 14 is an entire flow of another refresh control in the configuration illustrated in FIGS. 8 and 9. The management area of each page stores the entire number of writing at the time when writing to each page is performed. The refresh management area 16 illustrated in FIG. 8 stores the entire number of writing which is acquired by searching the management area at the time of power-on. Refresh control is performed by the processor 11 and the access controller 15 based on the acquired entire number of writing. In the present explanation, it is assumed that the refresh control is performed by the access controller 15. FIG. 15 illustrates change of state of the management area in the refresh control. In FIG. 15, a hatched area means a page to which writing is performed, and an underlined page number means a page to which refresh is performed.

The state illustrated in FIG. 15A is assumed to be an initial state. In the initial state, the entire number of writing is set to "0", and the number of writing of each page is set to "0." The threshold X is set to "4000." Now, consideration is given to a case where writing of data to the nonvolatile memory 14 is performed in the present state, under the control of the processor 11.

First, the refresh management area 16 is referred to by the access controller 15, and the entire number of writing in the nonvolatile memory 14 is acquired (Step 1401). When writing of data is performed to one of pages (Step 1402), the management area of the page concerned is also updated (Step 1403). Namely, the management area of each page is designed to store the entire number of writing at the time when writing of data is performed to the page concerned. The entire number of writing stored in the refresh management area 16 is also updated. The difference between the holding value of the management area of each page and the entire number of writing at this time is calculated by the access controller 15 (Step 1404). Then, it is determined whether or not the difference calculated at Step 1404 has reached the threshold X (Step 1405). In the determination at Step 1405, when it is determined that the difference calculated at Step 1404 has not reached the threshold X (NO), the processing is completed. In the determination at Step 1405, when it is determined that the difference calculated at Step 1404 has reached the threshold X (YES), a page with the largest difference calculated at Step 1404 is refreshed (Step 1406) and the management area of the refreshed page is updated (Step 1407). The entire number of writing stored in the refresh management area 16 is also updated. For example, in FIG. 15B, writing of data to Page 150 is performed and the entire number of writing in the management area is updated to "1." In an example illustrated in FIG. 15C, the management area corresponding to Page 1 is set to "5000." Since this value is the largest, it is shown that the current entire number of writing of the nonvolatile memory 14 is "5000." Next, when writing of data is performed to Page 300, the management area corresponding to Page 300 is updated to 5000+1=5001, as illustrated in FIG. 15D (Step 1403). In the state of FIG. 15C, the difference between the holding value of a management area of each page and the entire number of writing at this time is also calculated (Step 1404). Since the difference between the holding value ("1000") of the management area of Page 2 and the entire number of writing ("5000") at this time is "4000" and has reached the threshold X=4000, a page possessing the largest difference (Page 2 in the present case) is refreshed (Step 1406), and the management area of the page is updated to "5001."

According to the example, the following working-effects can be obtained.

(1) When writing of data is performed to one of pages (Step 1402), the entire number of writing is updated in the management area of the page to which the writing is performed (Step 1403). The difference between the holding value of the management area of each page and the entire number of writing at this time is calculated by the access controller 15 (Step 1404). Then, it is determined whether the difference calculated at Step 1404 has reached the threshold X (Step 1405). When it is determined as YES at Step 1405, a page with the largest difference calculated at Step 1404 is refreshed (Step 1406), and the management area of the refreshed page is updated (Step 1407). Accordingly, each page (Page 1-Page 511) of the nonvolatile memory 14 can be refreshed uniformly. Accordingly, the threshold of the memory cell is restored to a state before changing by the present refresh.

(2) Improvement in the reliability of the microcomputer 10 can be promoted by the working-effect (1).

(3) If the refresh is performed for every writing, every read-out, or every erasure in the nonvolatile memory 14, it is likely that the number of writing of each page may increase undesirably by the refresh operation. However, the difference between the holding value of the management area of each page and the entire number of writing at this time is calculated (Step 1404), and when it is determined that the difference has reached the threshold X (YES), a page possessing the largest difference among the calculated difference is refreshed. Accordingly, it is possible to avoid undesirable increase in the number of writing due to the refresh.

Embodiment 6

Figure 16:
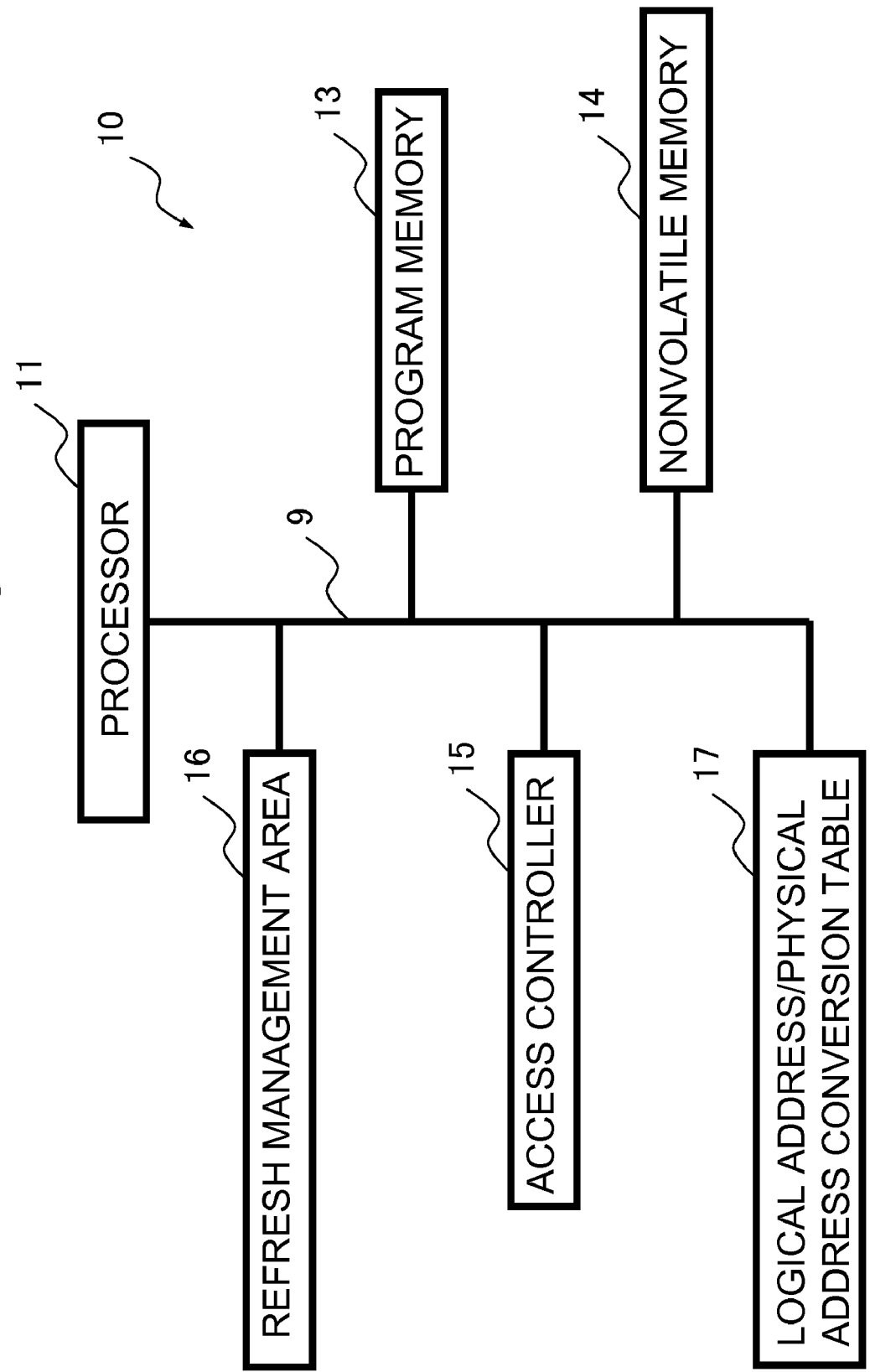
FIG. 16 is a block diagram of another exemplified configuration of a microcomputer as an example of a semiconductor device according to the present invention.

FIG. 16 illustrates another exemplified configuration of a microcomputer as an example of a semiconductor device according to the present invention. The microcomputer 10 illustrated in FIG. 16 is greatly different from the counterpart illustrated in FIG. 8 in the point that a logical address/physical address conversion table 17 for converting a logical address supplied from the processor 11 into a physical address in the nonvolatile memory 14 is provided. When the nonvolatile memory 14 is accessed by the access controller 15, the logical address is converted into the physical address of the nonvolatile memory 14 by the logical address/physical address conversion table 17, and writing, read-out, etc. in the nonvolatile memory 14 are performed in terms of the physical address. The nonvolatile memory 14 possesses a management area which is provided for every page, as illustrated in FIG. 17A, for example. The management area includes a storage area of a conversion flag and an entire number of writing, as illustrated in FIG. 17B. Here, the conversion flag indicates whether or not interchange of the physical address corresponding to the logical address is possible. For example, the conversion flag of a logical value "0" indicates that the interchange is possible and the conversion flag of a logical value "1" indicates that the interchange is not possible. The refresh management area 16 stores the entire number of writing which is acquired by searching the management area at the time of power-on. By providing the refresh management area 16, it becomes possible to save labor in searching the entire number of writing at every memory access.

Figure 18:
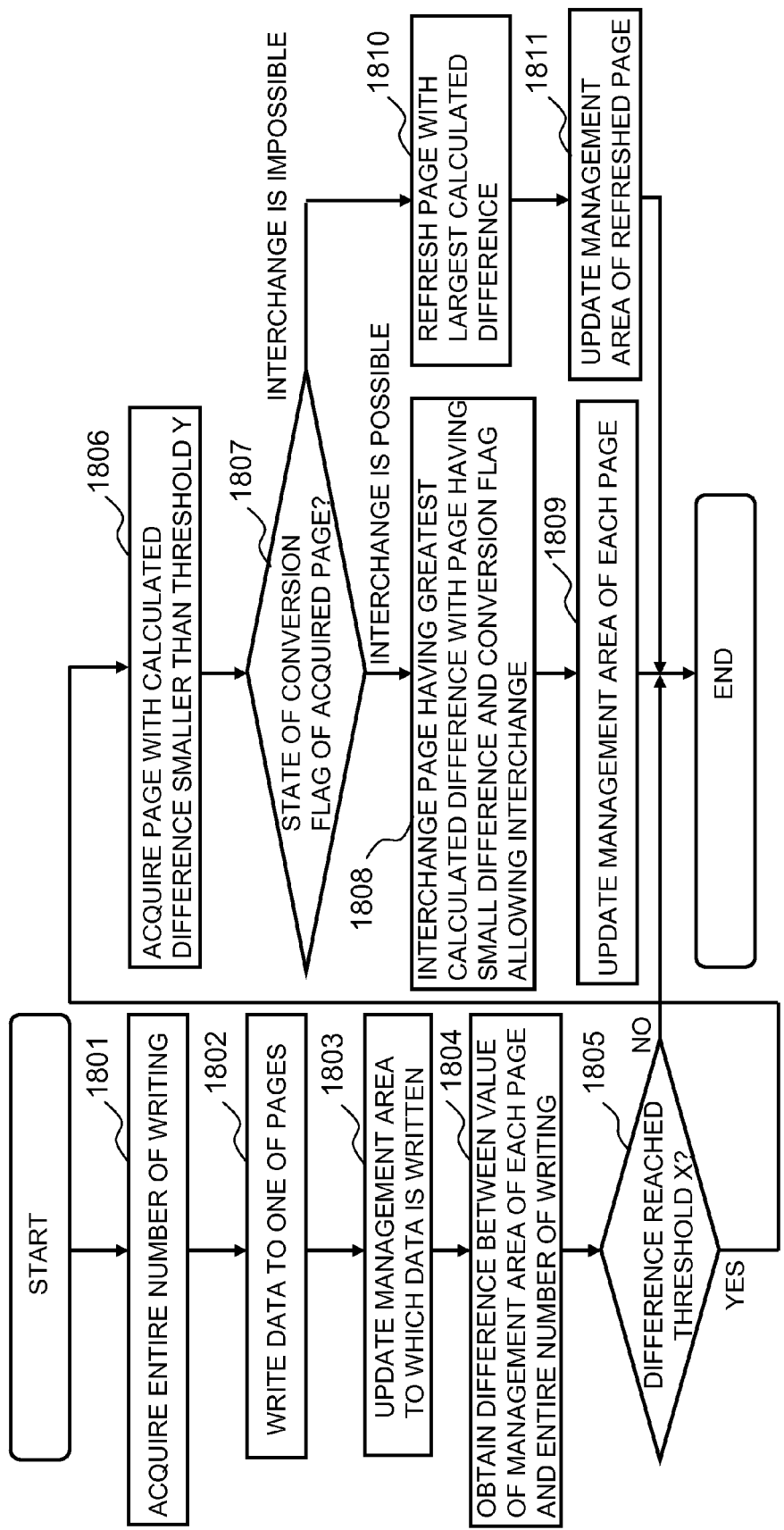
FIG. 18 is a flow chart of refresh control of a nonvolatile memory included in the microcomputer illustrated in FIG. 16.

FIG. 18 illustrates an entire flow of refresh control in the microcomputer illustrated in FIG. 16. Although the refresh control can be performed by the processor 11 and the access controller 15, it is assumed in the present explanation that the refresh control is performed by the access controller 15. FIG. 19 illustrates change of state of the management area in the refresh control. In FIG. 19, a hatched area means a page to which writing is performed, and an underlined page number means a page to which refresh is performed.

The state illustrated in FIG. 19A is assumed to be an initial state. In the initial state, in all the pages (for example, Page 1-Page 511), the conversion flag is set to a logical value "0", and the entire number of writing is set to "0", respectively. The threshold X is set to "4000." The entire number of writing is acquired by the access controller 15 in the present state (Step 1801). When writing of data is performed to one of pages (Step 1802), the management area of the page concerned is also updated (Step 1803). The entire number of writing stored in the refresh management area 16 is also updated. For example, as illustrated in FIG. 19B, when writing of data is performed to Page 150 by the access controller 15, the entire number of writing in the management area of Page 150 is updated to "1" from "0" until that moment by the access controller 15. The difference between the value of the management area of each page and the entire number of writing is calculated (Step 1804), and it is determined whether or not the difference has reached the threshold X (Step 1805). In an example illustrated in FIG. 19C, the value of the management area of Page 2 is set to "1000", accordingly the difference "4000" between the value "1000" and the entire number of writing at that time "5000" has reached the threshold X (here it is set to "4000"). Accordingly, it is determined as YES at Step 1805, and a page for which the difference calculated at Step 1804 is smaller than a threshold Y is acquired this time (Step 1806). Here, the threshold Y is set to a value smaller than the threshold X, for example, to "100", and stored at a suitable register, etc. in the processor 11. Then, the state of the conversion flag of the acquired page is checked (Step 1807). When the state of the conversion flag is a logical value "0", indicating that the interchange is possible, interchange of a page is performed between a page with the largest difference calculated, and a page with the difference smaller than the threshold Y, (Step 1808), and the management area of each page is also updated (Step 1809). In an example indicated in FIG. 19D, a page with the largest difference with the entire number of writing (5001) is Page 2, and a page with the difference smaller than the threshold Y is Page 1. Since the state of their conversion flags is a logical value "0", the interchange with Page 1 and Page 2 is performed here (Step 1808). The present interchange of the pages is realized by interchanging the physical address of Page 1 and the physical address of Page 2. After the interchange of Page 1 with Page 2 is performed, the management area of each page is updated (Step 1809). When it is determined at Step 1807 that the interchange is not possible (NO), the page with the largest difference is refreshed (Step 1810), and the management area of the refreshed page is updated (Step 1811). In an example indicated in FIG. 19E, Page 2 with the largest difference is refreshed, and the maximum number of writing of the management area is updated to "5001."

According to the example, the following working-effects can be obtained.

(1) When writing of data is performed by access controller 15, the difference between the value of the management area of each page and the entire number of writing is calculated (Step 1804), it is determined whether or not the difference has reached the threshold X (Step 1805), a page with the largest difference is refreshed (Step 1810), and the management area of the refreshed page is also updated (Step 1811). Therefore, each page (Page 1-Page 511) of the nonvolatile memory 14 can be refreshed uniformly. Accordingly, the threshold of the memory cell is restored to a state before changing by the present refresh.

(2) Between a page with the largest difference calculated and a page with the difference smaller than the threshold Y, the interchange of the pages is performed (Step 1808) and the management area of each page is also updated (Step 1809). The present interchange of the pages is realized by interchanging the physical address of Page 1 and the physical address of Page 2. Accordingly, the non-uniformity in the number of writing of each page (Page 1-Page 511) in the nonvolatile memory 14 is reduced further.

(3) Improvement in the reliability of the microcomputer 10 can be promoted by the working-effect (1) and the working-effect (2).

(4) If the refresh is performed for every writing, every read-out, or every erasure in the nonvolatile memory 14, it is likely that the number of writing of each page may increase undesirably by the refresh operation. However, the difference of the holding value of the management area of each page and the entire number of writing at the current time is calculated (1804), and, when it is determined that the difference has reached the threshold X, a page possessing the largest difference among the calculated difference is refreshed. Accordingly, it is possible to avoid undesirable increase in the number of writing due to the refresh.

The invention accomplished by the present inventors has been specifically explained in the above. However, it cannot be overemphasized that the present invention is not restricted to the embodiments, and it can be changed variously in the range which does not deviate from the gist.

For example, in the above described examples, it is assumed that the access controller 15 performs refresh control. However, a controller for exclusive use of the refresh control may be provided independently of the processor 11 or the access controller 15.

In the above described examples, every time writing to the nonvolatile memory is performed, a refresh-targeted page is determined based on a random number generated by the random number generator, and the total number of writing (the entire number of writing) is updated. However, every time erasure or read-out of the nonvolatile memory is performed, a refresh-targeted page may be determined based on a random number generated by the random number generator, and the total number of erasure or the total number of read-out may be undated.

In the above described examples, the refresh control is designed so as to be performed in terms of the number of writing of the nonvolatile memory. However, the refresh control may be performed in terms of the number of erasure or the number of read-out about all the pages in the nonvolatile memory, instead of the number of writing about all the pages in the nonvolatile memory.

Although the accessing target area is set per page (Page) in the above example, it is not restricted to the case. For example, the accessing target area may be set per sector or per block.

Furthermore, the entire number of writing may be stored in RAM (random access memory) in the microcomputer 10. If the RAM is not backed up by a battery etc., what is necessary is to evacuate the entire number of writing stored in the RAM to a suitable nonvolatile memory just before the power cutoff of the system, and to load the entire number of writing stored in the nonvolatile memory to the RAM at the power-on reset of the system.

The above description explains a case where the invention accomplished by the present inventors is applied mainly to the microcomputer which is the use field explained as the background. However, the present invention is not restricted to the case and can be widely applied to a semiconductor device.

What is claimed is:

1. A control method for a nonvolatile memory in a system including:
   a nonvolatile memory;
   a random number generator operable to generate a random number; and
   a controller coupled to the random number generator and operable to access the nonvolatile memory,
   the control method for the nonvolatile memory comprising the step of:
   making the controller perform refresh control to determine a refresh-targeted area based on a random number generated by the random number generator every time access to the nonvolatile memory is performed, and to re-write to the refresh-targeted area concerned.

2. A control method for a nonvolatile memory in a system including:
   a nonvolatile memory; and
   a controller operable to access the nonvolatile memory,
   the control method for the nonvolatile memory comprising the step of:
   making the controller perform refresh control to manage a total number of access to all accessing target areas and a refresh-targeted area in the nonvolatile memory, to update the total number of access to the nonvolatile memory every time access to the nonvolatile memory is performed, and to re-write to the refresh-targeted area based on the result of the updating.

3. The control method for the nonvolatile memory according to claim 2,
   wherein the refresh control performed by the controller includes:
   first processing for obtaining a total number of access to all accessing target areas in the nonvolatile memory, every time access to the nonvolatile memory is performed;
   second processing for comparing the total number obtained in the first processing with a prescribed threshold;
   third processing for performing re-writing to the refresh-targeted area according to the comparison result in the second processing; and
   fourth processing for updating the threshold according to need after the third processing.

4. The control method for the nonvolatile memory according to claim 2,
   wherein the refresh control performed by the controller includes:
   fifth processing for obtaining difference between the total number of access to all accessing target areas in the nonvolatile memory and the number of access to every accessing target area in the nonvolatile memory, every time access to the nonvolatile memory is performed;
   fifth processing for comparing the difference obtained in the fifth processing with a prescribed threshold; and
   seventh processing for determining a refresh-targeted area depending on the difference obtained in the sixth processing and for performing re-writing in order to refresh the refresh-targeted area.

5. The control method for the nonvolatile memory according to claim 2, wherein the refresh control performed by the controller includes:

eighth processing for obtaining difference between the total number of access to all accessing target areas in the nonvolatile memory and the number of access to every accessing target area in the nonvolatile memory, every time access to the nonvolatile memory is performed;

ninth processing for obtaining a first accessing target area corresponding to the difference smaller than a prescribed threshold, among the difference obtained in the eighth processing;

tenth processing for determining whether interchange of a physical address to a logical address is possible between the first accessing target area obtained in the ninth processing and a second accessing target area different from the first accessing target area;

eleventh processing for performing the interchange of the physical address to the logical address between the first accessing target area and the second accessing target area, when it is determined in the tenth processing that the interchange of the physical address to the logical address between the first accessing target area and the second accessing target area is possible; and twelfth processing for determining a refresh-targeted area according to the difference obtained in the eighth processing and for performing re-writing to refresh the refresh-targeted area, when it is determined in the tenth processing that the interchange of the physical address to the logical address is impossible.

6. The control method for the nonvolatile memory according to claim 5,
wherein the second accessing target area is determined based on the difference obtained in the eighth processing.

7. A semiconductor device including a nonvolatile memory, the semiconductor device comprising:
a random number generator operable to generate a random number; and
a controller operable to determine a refresh-targeted area based on a random number generated by the random number generator and operable to perform refresh control in order to perform re-writing to the refresh-targeted area concerned, every time access to the nonvolatile memory is performed.

8. A semiconductor device including a nonvolatile memory, the semiconductor device comprising:
a management area operable to manage a total number of access to all accessing target areas and a refresh-targeted area in the nonvolatile memory; and
a controller operable to update the total number of access to the nonvolatile memory and to perform refresh control in order to perform re-writing to the refresh-targeted area based on the updated result, every time access to the nonvolatile memory is performed.

9. The semiconductor device according to claim 8,
wherein the management area is formed by a part of a storage area in the nonvolatile memory.

10. The semiconductor device according to claim 8,
wherein the management area is formed by a semiconductor memory provided separately from the nonvolatile memory.

11. The semiconductor device according to claim 8,
wherein the controller performs processing including:
first processing for obtaining a total number of access to all accessing target areas in the nonvolatile memory, every time access to the nonvolatile memory is performed;
second processing for comparing the total number of access obtained in the first processing with a prescribed threshold;
third processing for performing re-writing to the refresh-targeted area according to the comparison result in the second processing; and
fourth processing for updating the threshold according to need after the third processing.

12. The semiconductor device according to claim 8,
wherein the controller performs processing including:
fifth processing for obtaining difference between the total number of access to all accessing target areas in the nonvolatile memory and the number of access to every accessing target area in the nonvolatile memory, every time access to the nonvolatile memory is performed;
fifth processing for comparing the difference obtained in the fifth processing with a prescribed threshold; and
seventh processing for determining a refresh-targeted area depending on the difference obtained in the sixth processing and for performing re-writing in order to refresh the refresh-targeted area.

13. The semiconductor device according to claim 8 further comprising:
a logical address/physical address conversion table operable to convert a logical address given externally to a physical address in the nonvolatile memory,
wherein the controller performs processing including:
eighth processing for obtaining difference between the total number of access to all accessing target areas in the nonvolatile memory and the number of access to every accessing target area in the nonvolatile memory, every time access to the nonvolatile memory is performed;
ninth processing for obtaining a first accessing target area corresponding to the difference smaller than a prescribed threshold, among the difference obtained in the eighth processing;
tenth processing for determining whether interchange of a physical address to a logical address is possible between the first accessing target area obtained in the ninth processing and a second accessing target area different from the first accessing target area;
eleventh processing for performing the interchange of the physical address to the logical address between the first accessing target area and the second accessing target area, when it is determined in the tenth processing that the interchange of the physical address to the logical address between the first accessing target area and the second accessing target area is possible; and
twelfth processing for determining a refresh-targeted area according to the difference obtained in the eighth processing and for performing re-writing to refresh the refresh-targeted area, when it is determined in the tenth processing that the interchange of the physical address to the logical address is impossible.

* * * * *